(12) United States Patent
Fujimura et al.

(10) Patent No.: US 12,730,959 B2
(45) Date of Patent: Sep. 8, 2026

(54) USING A MACHINE-TRAINED NETWORK TO PERFORM PHYSICAL DESIGN

(71) Applicant: D2S, Inc., San Jose, CA (US)

(72) Inventors: Akira Fujimura, Saratoga, CA (US); Nagesh Shirali, San Jose, CA (US); Donald Oriordan, Sunnyvale, CA (US)

(73) Assignee: D2S, INC., San Jose, CA (US)

( * ) Notice: Subject to any disclaimer, the term of this patent is extended or adjusted under 35 U.S.C. 154(b) by 751 days.

(21) Appl. No.: 17/950,080

(22) Filed: Sep. 21, 2022

(65) Prior Publication Data

US 2023/0092665 A1 Mar. 23, 2023

Related U.S. Application Data

(60) Provisional application No. 63/247,295, filed on Sep. 22, 2021.

(51) Int. Cl.
*G06F 30/398* (2020.01)
*G06F 30/12* (2020.01)

(52) U.S. Cl.
CPC ............ *G06F 30/398* (2020.01); *G06F 30/12* (2020.01)

(58) Field of Classification Search
CPC .................................................... G06F 30/398
USPC ........................................................ 716/132
See application file for complete search history.

(56) References Cited

U.S. PATENT DOCUMENTS 5,187,671 A 2/1993 Cobb
5,808,330 A 9/1998 Rostoker et al.
6,407,434 B1 6/2002 Rostoker et al.
6,480,990 B1 11/2002 Sharp et al.
6,829,757 B1 12/2004 Teig et al.
6,877,146 B1 4/2005 Teig et al.
6,928,633 B1 8/2005 Teig et al.
6,973,634 B1 12/2005 Teig et al.
7,096,449 B1 8/2006 Teig et al.
(Continued)

FOREIGN PATENT DOCUMENTS

CN 107438842 A 12/2017
CN 111758072 A 10/2020
(Continued)

OTHER PUBLICATIONS

Ajayi, Tutu, et al., "OpenROAD: Toward a Self-Driving, Open-Source Digital Layout Implementation Tool Chain," Proceedings of Government Microcircuit Applications and Critical Technology Conference, Jan. 1, 2019, 6 pages, National Science Foundation, retrieved from https://vlsicad.ucsd.edu/Publications/Conferences/370/c370.pdf.

(Continued)

*Primary Examiner* — Eric D Lee
(74) *Attorney, Agent, or Firm* — ADELI LLP

(57) ABSTRACT

A method of some embodiments receives an initial first physical design of a circuit. The method uses a machine-trained network to generate a second physical design that is a prediction of how the first physical design will look at a subsequent manufacturing stage. The method then uses the second physical design to modify the first physical design. Examples of such modifications include modifying a set of one or more routes in the first physical design and/or modifying a set of placement locations of a set of one or more sub-circuits or circuit components defined in the first physical design.

23 Claims, 9 Drawing Sheets

(56) References Cited

U.S. PATENT DOCUMENTS

| | | | |
|---|---|---|---|
| 7,107,564 | B1 | 9/2006 | Teig et al. |
| 7,117,468 | B1 | 10/2006 | Teig et al. |
| 7,269,817 | B2 | 9/2007 | Heng et al. |
| 7,310,793 | B1 | 12/2007 | Teig et al. |
| 7,441,220 | B2 | 10/2008 | Hetzel et al. |
| 7,526,748 | B2 | 4/2009 | Kotani et al. |
| 7,754,401 | B2 | 7/2010 | Fujimura et al. |
| 7,784,010 | B1 | 8/2010 | Balsdon et al. |
| 8,473,875 | B2 | 6/2013 | Fujimura et al. |
| 8,818,072 | B2 | 8/2014 | Ong et al. |
| 10,012,900 | B2 | 7/2018 | Kim et al. |
| 10,346,740 | B2 | 7/2019 | Zhang et al. |
| 10,444,629 | B2 | 10/2019 | Zable |
| 10,520,830 | B2 | 12/2019 | Kicken et al. |
| 10,628,546 | B1 | 4/2020 | Colwell et al. |
| 10,670,973 | B2 | 6/2020 | Zou et al. |
| 10,678,142 | B2 | 6/2020 | Jheng et al. |
| 10,783,292 | B1 | 9/2020 | Clewes et al. |
| 10,923,318 | B2 | 2/2021 | Gledhill et al. |
| 10,949,595 | B2 | 3/2021 | Tsutsui et al. |
| 11,043,359 | B2 | 6/2021 | Nakamura et al. |
| 11,132,489 | B1 | 9/2021 | Liu et al. |
| 2004/0210863 | A1 | 10/2004 | Culp et al. |
| 2005/0132306 | A1 | 6/2005 | Smith et al. |
| 2005/0138593 | A1 | 6/2005 | Okumura |
| 2005/0229134 | A1 | 10/2005 | Hetzel et al. |
| 2005/0251771 | A1 | 11/2005 | Robles |
| 2006/0066417 | A1 | 3/2006 | Yamanaga et al. |
| 2006/0190911 | A1 | 8/2006 | Stivers |
| 2008/0028352 | A1 | 1/2008 | Birch et al. |
| 2008/0109766 | A1 | 5/2008 | Song et al. |
| 2008/0115099 | A1 | 5/2008 | Patra |
| 2010/0035168 | A1 | 2/2010 | Nakajima et al. |
| 2011/0089345 | A1 | 4/2011 | Komagata et al. |
| 2011/0239181 | A1 | 9/2011 | Uchino |
| 2012/0094219 | A1 | 4/2012 | Fujimura et al. |
| 2012/0151422 | A1* | 6/2012 | White ..................... G06F 30/39 716/54 |
| 2013/0022929 | A1 | 1/2013 | Komagata et al. |
| 2013/0031524 | A1 | 1/2013 | He et al. |
| 2013/0159943 | A1 | 6/2013 | Agarwal et al. |
| 2013/0283216 | A1 | 10/2013 | Pearman et al. |
| 2013/0283218 | A1 | 10/2013 | Fujimura et al. |
| 2016/0125120 | A1 | 5/2016 | Yu et al. |
| 2016/0328511 | A1 | 11/2016 | Ning et al. |
| 2017/0185711 | A1 | 6/2017 | Fujiwara |
| 2017/0194126 | A1 | 7/2017 | Bhaskar et al. |
| 2017/0357911 | A1 | 12/2017 | Liu et al. |
| 2018/0067900 | A1 | 3/2018 | Mos et al. |
| 2019/0146355 | A1 | 5/2019 | Jheng et al. |
| 2019/0147134 | A1 | 5/2019 | Wang et al. |
| 2019/0197213 | A1 | 6/2019 | Ungar |
| 2019/0206041 | A1 | 7/2019 | Fang et al. |
| 2019/0377849 | A1 | 12/2019 | Sha et al. |
| 2019/0385300 | A1 | 12/2019 | Baidya et al. |
| 2020/0051781 | A1 | 2/2020 | Fujimura et al. |
| 2020/0065453 | A1 | 2/2020 | Kim et al. |
| 2020/0134131 | A1 | 4/2020 | Tien et al. |
| 2020/0159884 | A1 | 5/2020 | Kim et al. |
| 2020/0184137 | A1 | 6/2020 | Tsutsui et al. |
| 2020/0364394 | A1 | 11/2020 | Yu et al. |
| 2020/0380089 | A1 | 12/2020 | Gheith et al. |
| 2020/0380362 | A1 | 12/2020 | Cao et al. |
| 2020/0387660 | A1 | 12/2020 | Cecil |
| 2021/0048741 | A1 | 2/2021 | Lugg et al. |
| 2021/0181620 | A1 | 6/2021 | Poonawala et al. |
| 2021/0216697 | A1 | 7/2021 | Brink et al. |
| 2021/0279878 | A1 | 9/2021 | Adler et al. |
| 2021/0397172 | A1 | 12/2021 | Slachter et al. |
| 2022/0035237 | A1 | 2/2022 | Lee et al. |
| 2022/0050381 | A1 | 2/2022 | Biswas et al. |
| 2022/0128899 | A1 | 4/2022 | Fujimura et al. |
| 2022/0187713 | A1* | 6/2022 | Middlebrooks ..... G03F 7/70616 |
| 2022/0299881 | A1 | 9/2022 | Zheng et al. |
| 2022/0350951 | A1 | 11/2022 | Tong et al. |
| 2023/0024684 | A1 | 1/2023 | Fujimura et al. |
| 2023/0027655 | A1 | 1/2023 | Fujimura et al. |
| 2023/0032510 | A1 | 2/2023 | Fujimura et al. |
| 2023/0107556 | A1 | 4/2023 | Tao et al. |
| 2023/0153505 | A1 | 5/2023 | Chang et al. |
| 2023/0168660 | A1 | 6/2023 | Oriordan et al. |
| 2023/0169245 | A1 | 6/2023 | Oriordan et al. |
| 2023/0169246 | A1 | 6/2023 | Oriordan et al. |
| 2023/0169247 | A1 | 6/2023 | Oriordan et al. |
| 2023/0186009 | A1 | 6/2023 | Fujimura et al. |
| 2023/0205972 | A1 | 6/2023 | Oriordan et al. |
| 2023/0214571 | A1 | 7/2023 | Apte et al. |
| 2023/0229836 | A1 | 7/2023 | Oriordan et al. |
| 2023/0229840 | A1 | 7/2023 | Oriordan et al. |
| 2023/0229844 | A1 | 7/2023 | Oriordan et al. |
| 2023/0267265 | A1 | 8/2023 | Oriordan |
| 2023/0274065 | A1 | 8/2023 | Fujimura |
| 2023/0274066 | A1 | 8/2023 | Fujimura |
| 2023/0274067 | A1 | 8/2023 | Fujimura |
| 2023/0274068 | A1 | 8/2023 | Fujimura |
| 2023/0274069 | A1 | 8/2023 | Fujimura |
| 2023/0274070 | A1 | 8/2023 | Fujimura |
| 2023/0274071 | A1 | 8/2023 | Fujimura |
| 2023/0281374 | A1 | 9/2023 | Fujimura |
| 2023/0282635 | A1 | 9/2023 | Fujimura |
| 2023/0297756 | A1 | 9/2023 | Ruic |
| 2023/0306177 | A1 | 9/2023 | Fujimura |
| 2023/0351087 | A1 | 11/2023 | Oriordan et al. |
| 2023/0351088 | A1 | 11/2023 | Oriordan et al. |
| 2023/0351089 | A1 | 11/2023 | Oriordan et al. |
| 2023/0359804 | A1 | 11/2023 | Oriordan |
| 2024/0119214 | A1 | 4/2024 | Oriordan et al. |
| 2024/0288764 | A1 | 8/2024 | Hamouda |

FOREIGN PATENT DOCUMENTS

| | | | |
|---|---|---|---|
| CN | 113168085 | A | 7/2021 |
| CN | 113168115 | A | 7/2021 |
| EP | 3951496 | A1 | 2/2022 |
| JP | 2007536581 | A | 12/2007 |
| JP | 2012181298 | A | 9/2012 |
| JP | 2019114295 | A | 7/2019 |
| JP | 2021509208 | A | 3/2021 |
| KR | 102170578 | B1 | 10/2020 |
| KR | 20210010897 | A | 1/2021 |
| KR | 102377411 | B1 | 3/2022 |
| KR | 20260035214 | A | 3/2026 |
| TW | I710763 | B | 11/2020 |
| TW | 202113501 | A | 4/2021 |
| TW | 202121050 | A | 6/2021 |
| WO | 2018125220 | A1 | 7/2018 |
| WO | 2020193095 | A1 | 10/2020 |
| WO | 2021041963 | A1 | 3/2021 |
| WO | 2021043936 | A1 | 3/2021 |
| WO | 2022086825 | A1 | 4/2022 |

OTHER PUBLICATIONS

Ao, Jianchang, et. al., "Delay-Driven Layer Assignment in Global Routing under Multi-tier Interconnect Structure," ISPD '13: Proceedings of the 2013 ACM International Symposium on Physical Design, Mar. 2013, 7 pages, ACM, retrieved from https://dl.acm.org/doi/10.1145/2451916.2451942.

Author Unknown, "D2S Enables "Stitchless" Full-Chip Inverse Lithography Technology in a Single Day for the Multi-Beam Era," Press Release, Sep. 16, 2019, 3 pages, D2S, Inc., San Jose, California, USA.

Author Unknown, "D2S Unveils Industry's First Mask-Wafer Double Simulation Platform," Press Release, Sep. 20, 2011, 3 pages, D2S, Inc., San Jose, California, USA.

Author Unknown, "Deep reinforcement learning," Wikipedia, Sep. 21, 2020, 2 pages, Wikipedia.com.

Author Unknown, "Design rule checking," Wikipedia, May 27, 2020, 4 pages, Wikipedia.com.

Author Unknown, "Marching squares," Wikipedia, Dec. 30, 2019, 9 pages, Wikipedia.com.

(56) References Cited

OTHER PUBLICATIONS

Author Unknown, "Multiple patterning," Wikipedia, Oct. 10, 2020, 22 pages, Wikipedia.com.
Author Unknown, "Optical proximity correction," Wikipedia, Apr. 28, 2019, 5 pages, Wikipedia.com.
Author Unknown, "Rasterisation," Wikipedia, Aug. 21, 2020, 4 pages, Wikipedia.com.
Author Unknown, "TrueMask® DS," Exact Date Unknown but Before May 2020, 3 pages, D2S, Inc., retrieved from https://design2silicon.com/products/truemask-ds/.
Author Unknown, "TrueMask® ILT Backgrounder Stitchless Full-Chip ILT in a Day," Backgrounder, Sep. 2019, 6 pages, D2S, Inc., San Jose, California, USA.
Author Unknown, "TrueMask® ILT," Exact Date Unknown but Before May 2020, 7 pages, D2S, Inc., retrieved from https://design2silicon.com/products/truemask-ilt/.
Cecil, Thomas, et al., "Establishing Fast, Practical, Full-Chip ILT Flows Using Machine Learning," SPIE Proceedings 11327, Optical Microlithography XXXIII, Mar. 23, 2020, 19 pages, vol. 1132706, SPIE, San Jose, California, USA.
Chen, Kun-Yuan, et al., "Full-Chip Application of Machine Learning SRAFs on DRAM Case Using Auto Pattern Selection," SPIE Proceedings 10961, Optical Microlithography XXXII, Oct. 10, 2019, 13 pages, vol. 1096108, SPIE, San Jose, California, USA.
Chen, Tai-Chen, "Multilevel Full-Chip Gridless Routing With Applications to Optical-Proximity Correction," Jun. 2007, 13 pages, IEEE, retrieved from http://cc.ee.ntu.edu.tw/~ywchang/Papers/tcad07-mgr.pdf.
Jia, Ningning, et al., "Machine Learning for Inverse Lithography: using stochastic gradient descent for robust photomask synthesis," Journal of Optics, Apr. 1, 2010, 9 pages, vol. 12, IOP Publishing, retrieved from https://www.eee.hku.hk/optima/pub/journal/1004_JO.pdf.
Kwan, Joe, et al., "Applying Machine Learning Techniques to Accelerate Advanced Process Yield Ramp," Jan. 5, 2021, 29 pages, Siemens Digital Industries Software, Munich, Germany.
Lin, Yibo, et al., "Machine Learning for Yield Learning and Optimization," 2018 IEEE International Test Conference (ITC), University of Texas, Oct. 29-Nov. 1, 2018, 10 pages, IEEE, Phoenix, AZ, USA.
Liu, Peng, "Mask Synthesis Using Machine Learning Software and Hardware Platforms," SPIE Proceedings 11327, Optical Microlithography XXXIII, Mar. 23, 2020, 17 pages, vol. 1132707, SPIE, San Jose, California, USA.
Mitchell, Robin, "IMEC Demonstrates Buried Power Rails in FinFET CMOS," Mar. 17, 2021, 6 pages, EPM, retrieved from https://www.electropages.com/blog/2021/03/imec-demonstrates-buried-power-rails-finfet-cmos.
Mitra, Joydeep, et al., "RADAR: RET-Aware Detailed Routing Using Fast Lithography Simulations," Proceedings 2005, 42nd Design Automation Conference, Jun. 13-17, 2005, 6 pages, IEEE, retrieved from https://citeseerx.ist.psu.edu/viewdoc/download?doi=10.1.1.103.2367&rep=rep1&type=pdf.
Naik, Mehul, "Challenges to Interconnect Scaling at 3nm and Beyond," Applied Materials, Jun. 14, 2021, 9 pages, Applied Materials, Inc., retrieved from https://www.appliedmaterials.com/us/en/blog/blog-posts/challenges-to-interconnect-scaling-at-3nm-and-beyond.html.
Pang, Linyong (Leo), et al., "Study of Mask and Wafer Co-design That Utilizes a New Extreme SIMD Approach to Computing in Memory Manufacturing: Full-Chip Curvilinear ILT in a Day," SPIE Proceedings 11148, Photomask Technology 2019, Oct. 3, 2019, 16 pages, vol. 111480U, SPIE, retrieved from https://design2silicon.com/wp-content/uploads/2019/11/2019-BACUS-Full-Chip-Curvilinear-ILT-091219s-003.pdf.
Pang, Linyong, "Inverse Lithography Technology: 30 years from concept to practical, full-chip reality," Journal of Micro/Nanopatterning, Materials, and Metrology, Aug. 31, 2021, 49 pages, vol. 20(3), SPIE, retrieved from https://www.spiedigitallibrary.org/journals/journal-of-micro-nanopatterning-materials-and-metrology/volume-20/issue-03/030901/Inverse-lithography-technology--30-years-from-concept-to-practical/10.1117/1.JMM.20.3.030901.full.
Pang, Linyong, et al., "How GPU-Accelerated Simulation Enables Applied Deep Learning for Masks and Wafers," Month Unknown 2019, 10 pages, D2S, Inc., San Jose, California, USA.
Pang, Linyong, et al., "Making Digital Twins using the Deep Learning Kit (DLK)," Month Unknown 2019, 13 pages, D2S, Inc., San Jose, California, USA.
Pradipta, Geraldo, et al., "A Machine Learning Based Parasitic Extraction Tool," Oct. 31, 2019, 3 pages, University of Minnesota, Minneapolis, Minnesota, USA.
Prasad, Divya, "Can we Bury our Scaling Problems with Buried Power Rails and Back-side Power Delivery?," Mar. 5, 2020, 8 pages, Arm Limited, retrieved from https://community.arm.com/arm-research/b/articles/posts/can-we-bury-our-scaling-problems-with-buried-power-rails-and-back-side-power-delivery.
Rahman, M. Sohel, et. al., "MultiResUNet: Rethinking the U-Net Architecture for Multimodal Biomedical Image Segmentation," Feb. 2019, 25 pages, retrieved from https://arxiv.org/pdf/1902.04049.pdf.
Ren, Haoxing (Mark), "Machine Learning and Deep Learning Applications in Design Automation and Practical Issues," Dac 19 Tutorial, Month Unknown 2019, 55 pages, Nvidia Corporation, Santa Clara, California, USA.
Ronneberger, Olaf, et. al., "U-Net: Convolutional Networks for Biomedical Image Segmentation," May 2015, 8 pages, retrieved from https://arxiv.org/pdf/1505.04597.pdf.
Shi, Xuelong, et al., "Physics based feature Vector Design: a Critical Step Towards Machine Learning based Inverse Lithography," SPIE Proceedings 11327, Optical Microlithography XXXIII, Mar. 23, 2020, 8 pages, vol. 113270A, SPIE, San Jose, California, USA.
Sole, Marc Pons, "Layout Regularity for Design and Manufacturability," Doctoral Thesis, Jul. 8, 2012, 185 pages, Technical University of Catalonia, Barcelona, Spain.
Sperling, Ed, "Design Rule Complexity Rising," Semiconductor Engineering—Deep Insights for the Tech Industry, Apr. 19, 2018, 16 pages, SMG, retrieved from https://semiengineering.com/design-rule-complexity-rising/.
Teig, Steven L., "The X architecture: not your father's diagonal wiring," SLIP '02: Proceedings of the 2002 international workshop on System-level interconnect prediction, Apr. 6, 2002, 5 pages, ACM, retrieved from https://dl. acm.org/doi/10.1145/505348.505355.
Wang, Shibing, et al., "Efficient Full-Chip SRAF Placement Using Machine Learning for Best Accuracy and Improved Consistency," SPIE Proceedings 10587, Optical Microlithography XXXI, Mar. 20, 2018, 10 pages, vol. 105870N, SPIE, San Jose, California, USA.
Wang, Shibing, et al., "Machine Learning Assisted SRAF Placement for Full Chip," SPIE Proceedings 10451, Photomask Technology 2017, Oct. 16, 2017, 8 pages, vol. 104510D, SPIE, Monterey, California, USA.
Yang, Dingcheng, et al., "CNN-Cap: Effective Convolutional Neural Network Based Capacitance Models for Full-Chip Parasitic Extraction," 2021 International Conference on Computer Aided Design, Jul. 14, 2021, 9 pages, IEEE, retrieved from https://arxiv.org/pdf/2107.06511.pdf.
Shao, Hao-Chiang, et. al., "From IC Layout to Die Photograph: A CNN-Based Data-Driven Approach" IEEE Transactions on Computer-Aided Design of Integrated Circuits and Systems, vol. 40, No. 5, May 2021, pp. 957-970, IEEE.
Staepelaere, David Joseph, "Geometric Transformations for a Rubber-band Sketch," Master's Thesis, Sep. 1992, 71 pages, University of California at Santa Cruz, Santa Cruz, CA.
Dounde, Amit, et al., "A Study of Curvilinear Routing in IN5 Standard Cells: Challenges and Opportunities," Photomask Technology 2019, Sep. 26, 2019, p. 48, SPIE.

* cited by examiner

USING A MACHINE-TRAINED NETWORK TO PERFORM PHYSICAL DESIGN

BACKGROUND

An integrated circuit ("IC") is a device that includes many electronic components, such as transistors, resistors, diodes, etc. These components are often defined on a semiconductor substrate and interconnected with metal wiring and vias to form multiple circuit components, such as gates, cells, memory, units, arithmetic units, controllers, decoders, etc. An IC typically includes multiple layers of wiring and vias that interconnect its electronic and circuit components.

Design engineers design ICs by transforming logical or circuit descriptions of the IC components into geometric descriptions, called layouts. IC layouts typically include (1) geometric representations of electronic or circuit IC components (called circuit modules) with pins, and (2) geometric representations of wiring (called interconnect lines below) that connect the pins of the circuit modules. A net is typically defined as a collection of pins that need to be connected. To create layouts, design engineers typically use electronic design automation ("EDA") applications. These applications provide sets of computer-based tools for creating, editing, and analyzing IC design layouts.

Fabrication foundries manufacture ICs based on these IC design layouts. To fabricate an IC after designing of the IC layout is completed, lithographic masks are created based on the IC layout so that the masks contain various geometries that when used in lithographic processes produce the various geometries of the IC layout on a semiconductor wafer. The produced geometries represent the elements (such as IC components, interconnect lines, via pads, etc.) of the IC.

Even when the IC design layouts are otherwise valid, fabs cannot always reliably manufacture ICs unless the IC design layouts effectively account for capabilities, settings and variances of the manufacturing processes employed by the fabs. When IC design layouts are completed without taking into account these manufacturing constraints, the IC design layouts at times need to be modified after they are completed and sent over to the fabs.

SUMMARY

Some embodiments of the invention provide novel methods for using machine-trained networks to quickly predict whether a circuit's physical design meet the design considerations for the circuit. The methods of some embodiments are used during the physical design to improve the overall quality of the designs that are produced by one or more physical design tools, such as the placer, router, compactor, etc.

A method of some embodiments receives an initial first physical design of a circuit (e.g., an integrated circuit, IC). The first physical design in some embodiments is an initial first design layout that is produced after a physical design operation or after a physical design stage by a physical design tool (such as a floor planer, placer, router, compactor, etc.). The method uses a machine-trained network to generate a second physical design (e.g., a second physical design layout) that is a prediction of how the first physical design will look at a subsequent manufacturing stage. The method then uses the second physical design to modify the first physical design. Examples of such modifications include modifying a set of one or more routes in the first physical design and/or modifying a set of placement locations of a set of one or more sub-circuits or circuit components defined in the first physical design.

The method of different embodiments uses the second physical design in different ways. For instance, in some embodiments, the method generates a display of the second physical design for a designer to review. The designer reviews the generated display to determine whether the second physical design meets a set of one or more design considerations. Through a user interface, the method receives modifications to the first physical design from the designer after the designer has reviewed the displayed second physical design. The method then modifies the first physical design based on the modifications provided by the designer.

In some embodiments, the method uses an automated process to analyze the second physical design to determine whether a set of one or more design constraints has been met. When the second physical design does not meet a design constraint in the set of design constraints, the method in some embodiments uses one or more automated processes to modify the first physical design in order to produce a physical design that meets the desired design constraints. Conjunctively, or alternatively, the method in some embodiments uses the second physical design to compute a physical design cost for the first physical design, and then uses the computed cost to determine whether a set of one or more changes to the first physical design should be accepted.

The method of some embodiments bases its operations on a set of manufacturing parameters associated with a manufacturing process that will be used to generate the circuit (e.g., the IC) from the physical design that the method produces. Examples of manufacturing processes include manufacturing processes used to manufacture the circuit (e.g., the IC) from the first physical design and/or mask making processes used to manufacture a plurality of masks used to fabricate the circuit (e.g., the IC), while examples of manufacturing parameters include manufacturing variances that express a range of one or more variations in using the particular manufacturing process to manufacture design components according to the physical design produced by the method.

In some embodiments, the method uses the set of manufacturing parameters to define a set of parameters of the machine-trained network before the machine-trained network is used to generate the second physical design. In other embodiments, the method uses the set of manufacturing parameters along with the first physical design as inputs to the machine-trained network in order to generate the second physical design. The machine-trained network in some embodiments produces an output that comprises the second physical design, e.g., receives one or more patterns as inputs and produces an output that represents a transformed pattern for each input pattern, with each transformed pattern representing a predicted manufactured appearance of its corresponding input pattern. In other embodiments, the machine-trained network produces a set of parameters that is then used by another process to generate the second physical design.

The first and second physical designs in some embodiments both include several shapes that represent several design components (e.g., circuits, pins, vias, wiring, etc.). In some embodiments, some or all of the shapes in the second physical design represent predicted manufactured shapes of some or all of the shapes in the first physical design. In some of these embodiments, the method uses the second physical design to determine whether one or more shapes in the second physical design satisfy one or more design considerations. Design considerations in some embodiments include ad hoc considerations that a designer can take into account in designing a circuit (an IC), or more rigorous design constraints that specify conditions that circuit designs have to meet or should meet. Examples of design constraints include distance constraints and capacitance constraints.

To determine whether one or more shapes in the second physical design satisfy one or more design considerations, the method of some embodiments provides a display of the second design and identifies a set of locations in the second design that should be reviewed by the designer to assess whether a set of shapes at the identified set of locations satisfy design considerations. When the designer provides input regarding a group of locations in the second physical design that should be modified, the method identifies a group of locations in the first physical design that corresponds to the group of locations in the second physical design, and modifies the first physical design at the identified group of locations in the first physical design.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description, the Drawings and the Claims is needed. Moreover, the claimed subject matters are not to be limited by the illustrative details in the Summary, Detailed Description and the Drawing

BRIEF DESCRIPTION OF FIGURES

The novel features of the invention are set forth in the appended claims. However, for purposes of explanation, several embodiments of the invention are set forth in the following figures.

DETAILED DESCRIPTION

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

Some embodiments of the invention provide novel methods for using machine-trained networks as quick predicting tools to determine whether physical designs of circuits meet desired design considerations. The machine-trained networks of some embodiments are used during the physical design to improve the overall quality of the designs that are produced by one or more physical design tools, such as the placer, router, compactor, etc. The machine-trained networks operate faster than the overall operation of the physical design tools. Employing these networks during the physical design processes improves the quality and overall speed of the design process as it reduces the number of back and forth iterations between the physical design tools and between the physical design stage and the manufacturing stage (e.g., the mask making stage or post-mask making stages).

Figure 1:
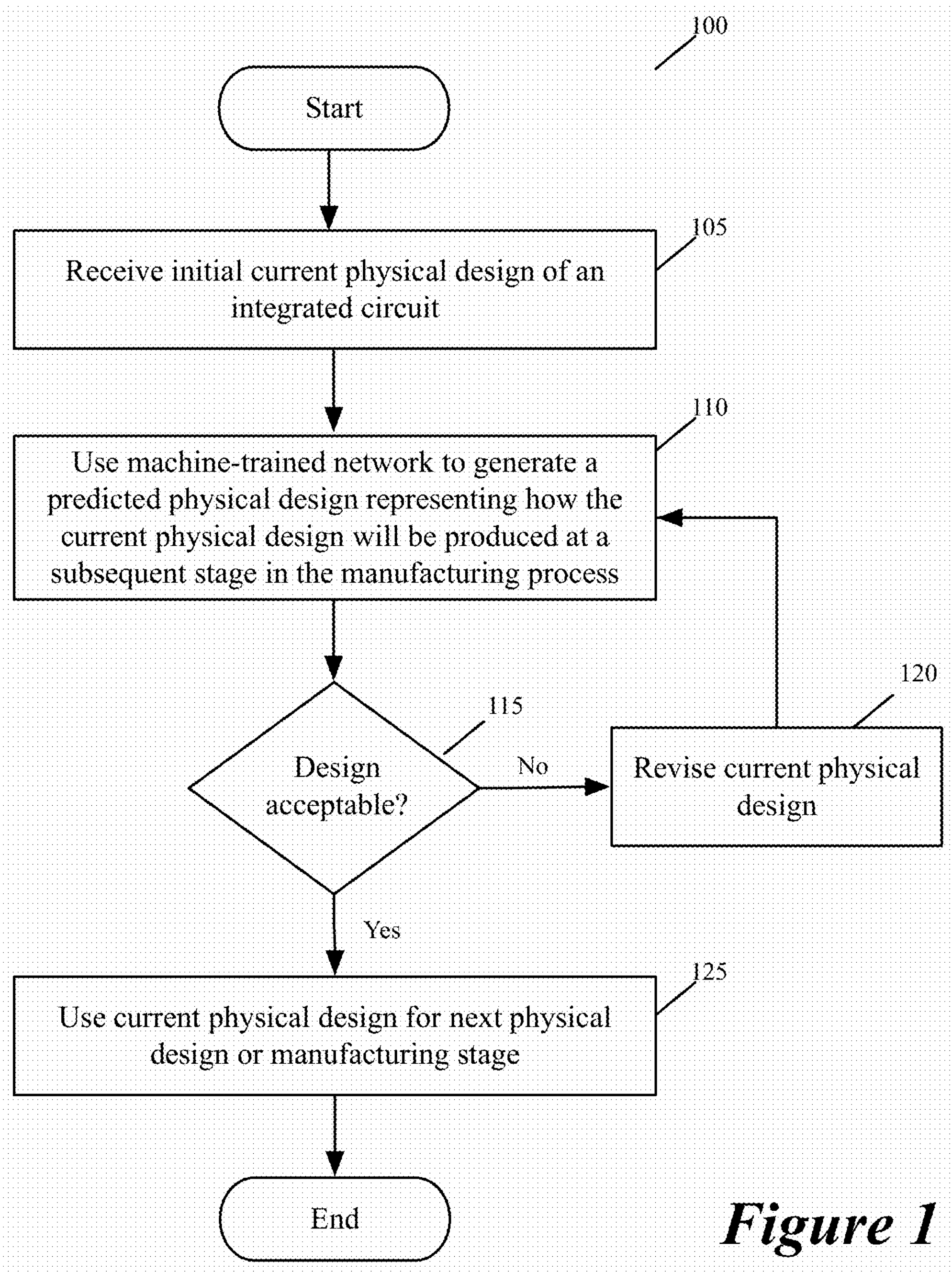
FIG. 1 illustrates a process that uses the method of some embodiments.

FIG. 1 illustrates a process 100 that uses the method of some embodiments. The process 100 is used during a physical design stage, such placement, routing or compaction. As shown, the process 100 initially receives (at 105) an initial first physical design layout of an IC. The first physical design layout is produced after a physical design operation or after a physical design stage by a physical design tool (such as a placer, router, compactor, etc.). In some embodiments, the first physical design layout is the design layout after the tool has performed a set of one or more modifications to the design layout, and then calls the process 100 to evaluate whether the set of one or more modifications should be maintained or discarded. Examples of such modifications include identifying one or more routes by a router or one or more placements by a placer. In some embodiments, the process 100 performs a constraint check to determine whether the set of modifications should be maintained or discarded, while in other embodiments, the process 100 computes a cost for the set of modifications that the design tool can evaluate to determine whether the set of modifications should be maintained or discarded.

The process 100 uses (at 110) a machine-trained network to generate a second physical design layout (referred to below as the predicted physical design) that is a prediction of how the first physical design layout will look at a subsequent manufacturing stage. The first and second physical designs in some embodiments both include several shapes that represent several design components (e.g., circuits, pins, vias, wiring, etc.). In some embodiments, some or all of the shapes in the second physical design represent predicted shapes of a some or all of the shapes in the first physical design at a subsequent manufacturing stage.

Figure 2:
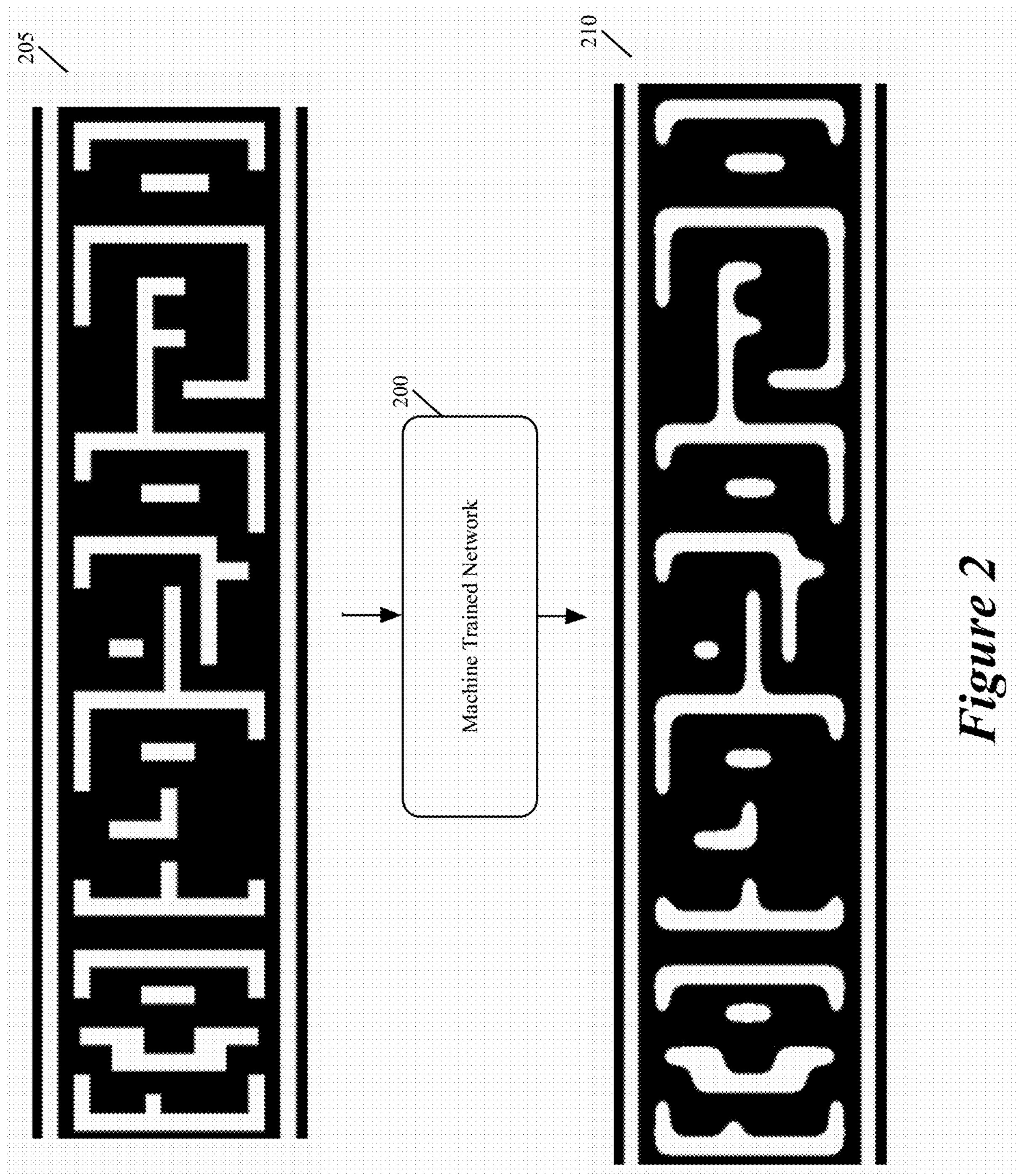
FIG. 2 illustrate an example of a machine-trained network producing a second physical design layout from a first physical design layout.

FIG. 2 illustrates an example of a machine-trained network 200 producing a second physical design layout 210 from a first physical design layout 205. The first physical design layout 205 in this example is a portion of a larger IC design layout. Specifically, the first layout 205 is a portion of a wiring layer N of an IC. In this figure, the white lines represent the wires (interconnect lines) of the wiring layer, while the black background represents areas on the wiring layer that are not occupied by wires.

In FIG. 2, the second physical design layout 210 is a prediction produced by the machine-trained network for how the first physical design layout 205 will be produced (e.g., will appear) at a subsequent stage in the manufacturing process. In some embodiments, the subsequent stage is a subsequent mask making stage, while in other embodiments the subsequent stage is the IC fabrication stage. Hence, in some embodiments, the second physical design layout 210 is a prediction as to how the mask(s) will appear during or after the mask making stage (e.g., after mask simulation or after wafer simulation operations), while in other embodiments the second physical design layout 210 is a prediction as to how the manufactured IC will appear after it is manufactured.

As shown, the interconnect lines in the second physical design layout 210 are deformed versions of the interconnect lines in the first physical design layout 205. These deformities in some embodiments are due to physical constraints on the mask-making process and/or IC manufacturing process. The machine-trained network 200 in some embodiments produces an output that comprises the second physical design, e.g., receives one or more patterns of the first physical design layout as inputs and produces an output that represents a transformed pattern for each input pattern, with each transformed pattern representing a predicted manufactured appearance of its corresponding input pattern. In other embodiments, the machine-trained network produces a set of parameters that are then used by another process to generate the second physical design.

To perform its operation, the machine-trained network 200 uses a set of manufacturing parameters associated with a manufacturing process that will be used to generate the IC from the first physical design 205. Examples of manufacturing processes include manufacturing processes used to manufacture the circuit (e.g., the IC) from the first physical design, mask making processes used to manufacture a plurality of masks used to fabricate the circuit (e.g., the IC), and/or wafer simulation processes used to generate a simulated wafer that represents a prediction as to how the wafer would look once it is manufactured. In some embodiments, examples of manufacturing parameters include manufacturing variances that express a range of one or more variations in using the particular manufacturing process to manufacture design components according to the physical design produced by the method.

In some embodiments, the process 100 uses the set of manufacturing parameters to define a set of parameters of the machine-trained network 200 before it uses the machine-trained network 200 to generate the second physical design 210. In other embodiments, the process 100 provides the set of manufacturing parameters along with the first physical design as inputs to the machine-trained network 200 in order to generate the second physical design.

After generating (at 110) the predicted physical design, the process 100 uses the predicted physical design to determine (at 115) whether the current physical design is acceptable. If not, the process modifies (at 120) the current physical design and returns to 110 to assess whether the modified physical design produces a predicted physical design that is acceptable. Examples of such modifications include modifying a set of one or more routes in the current physical design and/or modifying a set of placement locations of a set of one or more circuits defined in the current physical design. When the process determines (at 115) that the current physical design is acceptable, the process uses (at 125) the current physical design for the next stage in the design or manufacturing of the IC, and then ends.

In different embodiments, the process 100 uses (at 115) the predicted physical design differently to assess the current design. For instance, in some embodiments, the process 100 uses the predicted physical design to determine whether one or more shapes in the predicted physical design satisfy one or more design considerations. Design considerations in some embodiments include ad hoc considerations that a designer can take into account in designing a circuit (an IC), or more rigorous design constraints that specify conditions that circuit designs have to meet or should meet. Examples of design constraints include distance constraints (e.g., minimum distances enforced by design rule checks, i.e., DRC rules) and capacitance constraints.

In some embodiments, the process 100 generates a display of the second physical design for a designer to review. The designer reviews the generated display to determine whether the predicted physical design meets a set of one or more design considerations. Through a user interface, the process 100 receives modifications to the current physical design from the designer after the designer has reviewed the displayed predicted physical design and identified one or more items in the design that need to be modified. The process 100 then modifies the first physical design based on the input provided by the designer.

Figure 3:
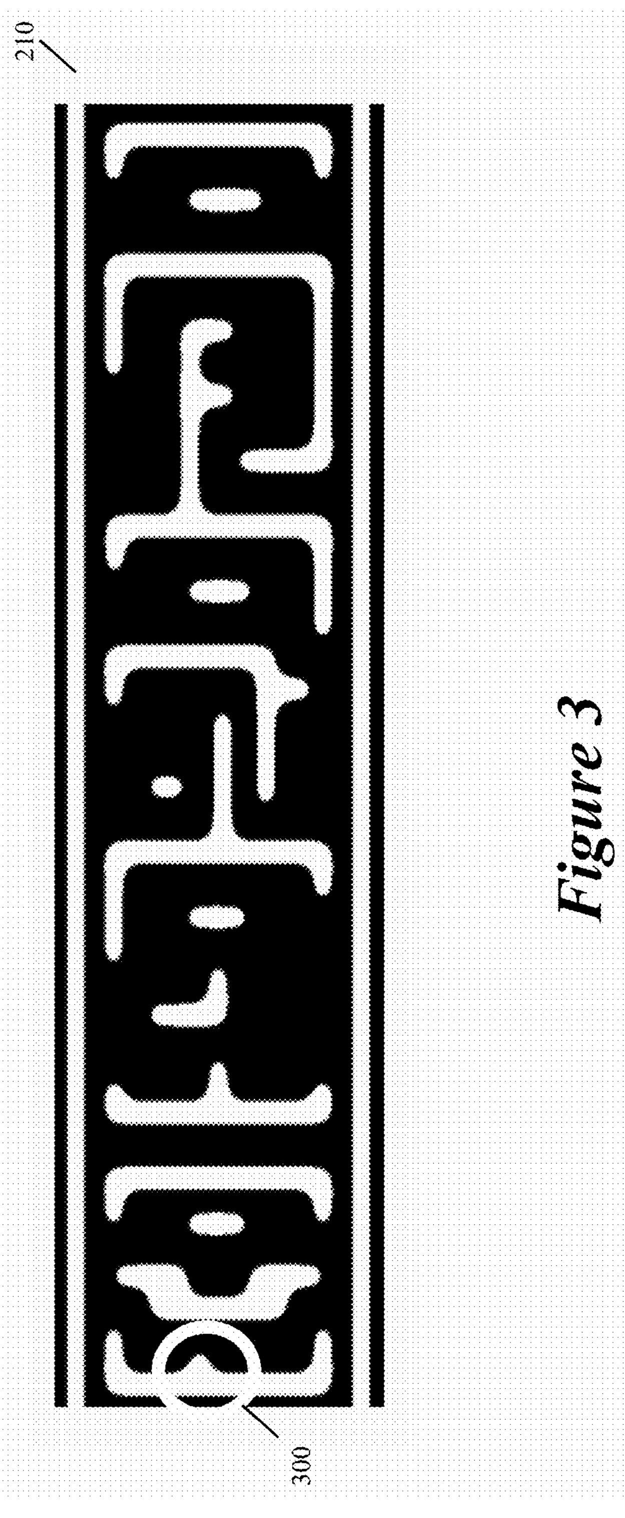
FIG. 3 illustrates an example of identifying a location of concern in a predicted physical design.

In some embodiments, the process 100 identifies areas of potential concern for a designer by highlighting a set of locations in the predicted design that should be reviewed by the designer to assess whether a set of shapes at the identified set of locations satisfy design considerations. FIG. 3 illustrates an example of identifying a location of concern in a predicted physical design. This figure illustrates location 300 in the predicted physical design 210 being identified as a location of concern. In this example, the interconnect wiring at this location 300 is predicted to be short and have a sharp vertex, which might have undesirable capacitive properties.

The process 100 also provides UI tools that allow the designer to provide input regarding a group of locations in the predicted physical design that should be modified. For instance, the UI tools include one or more selection tools through which the designer can select for further analysis locations highlighted by the process 100 and/or other locations in the predicted design layout. Once the designer identifies this group of locations in the predicted physical design, the process 100 identifies a group of locations in the current physical design that corresponds to the identified group of locations in the predicted physical design, and modifies the current physical design at the identified group of locations in the first physical design.

To identify the corresponding locations in the predicted and current physical designs, the process 100 in some embodiments creates and/or uses associations between elements (e.g., wire segments) in the current physical design and elements (e.g., wire segments) in the predicted physical design. In some embodiments, the designer uses the UI tools to select elements in the predicted physical design that should be further analyzed and/or modified. Through the specified associations between predicted-design elements and current-design elements, the process 100 then identifies the corresponding elements in the current physical design that relate to the selected elements in the predicted physical design, and then modifies and/or further analyzes the identified current-design elements. Instead of creating and/or using associations between predicted-design elements and current-design elements, the process 100 in other embodiments simply uses the locality (e.g., the bounding box, set of the coordinates, etc.) identified by the designer in the predicted design to identify a corresponding location (e.g., bounding box, set of coordinates, etc.) in the current design for analysis and/or modification.

In some embodiments, the process 100 uses (at 115) an automated process to analyze the predicted physical design to determine whether a set of one or more design constraints (e.g., distance constraints, capacitance constraints, etc.) have been met. When the predicted physical design does not meet a design constraint (e.g., a spacing constraint of a DRC rule) in the set of design constraints, the process 100 in some embodiments uses one or more automated processes to modify the current physical design in order to produce a physical design that meets the desired design constraints.

Conjunctively, or alternatively, the process 100 in some embodiments (at 115) uses the predicted physical design to compute a physical design cost for the current physical design, and then uses the computed cost to determine whether a set of one or more changes to the current physical design should be accepted. In some embodiments, identified changes (also called solutions) are rejected when they result in a worst cost than a previously identified change.

In other embodiments, however, a solution with a worst cost can be accepted so long as it meets one or more criteria (e.g., is identified earlier in the tool's exploration of the solution, and/or is not worse than a threshold value from the previous best solution identified). Physical design tool use optimization operations that allow the tools to accept identified solutions (e.g., routes or placements) that have worst costs than previously identified solutions, in order to ensure that the tool's exploration of the solution space does not get stuck after identifying a local minima in the solution space. However, many of these optimization operations accept fewer solutions over time that have poorer costs than previously identified solutions in order to ensure that the tool's search of the solution space eventually starts to converge to finding an optimal solution.

Figure 4:
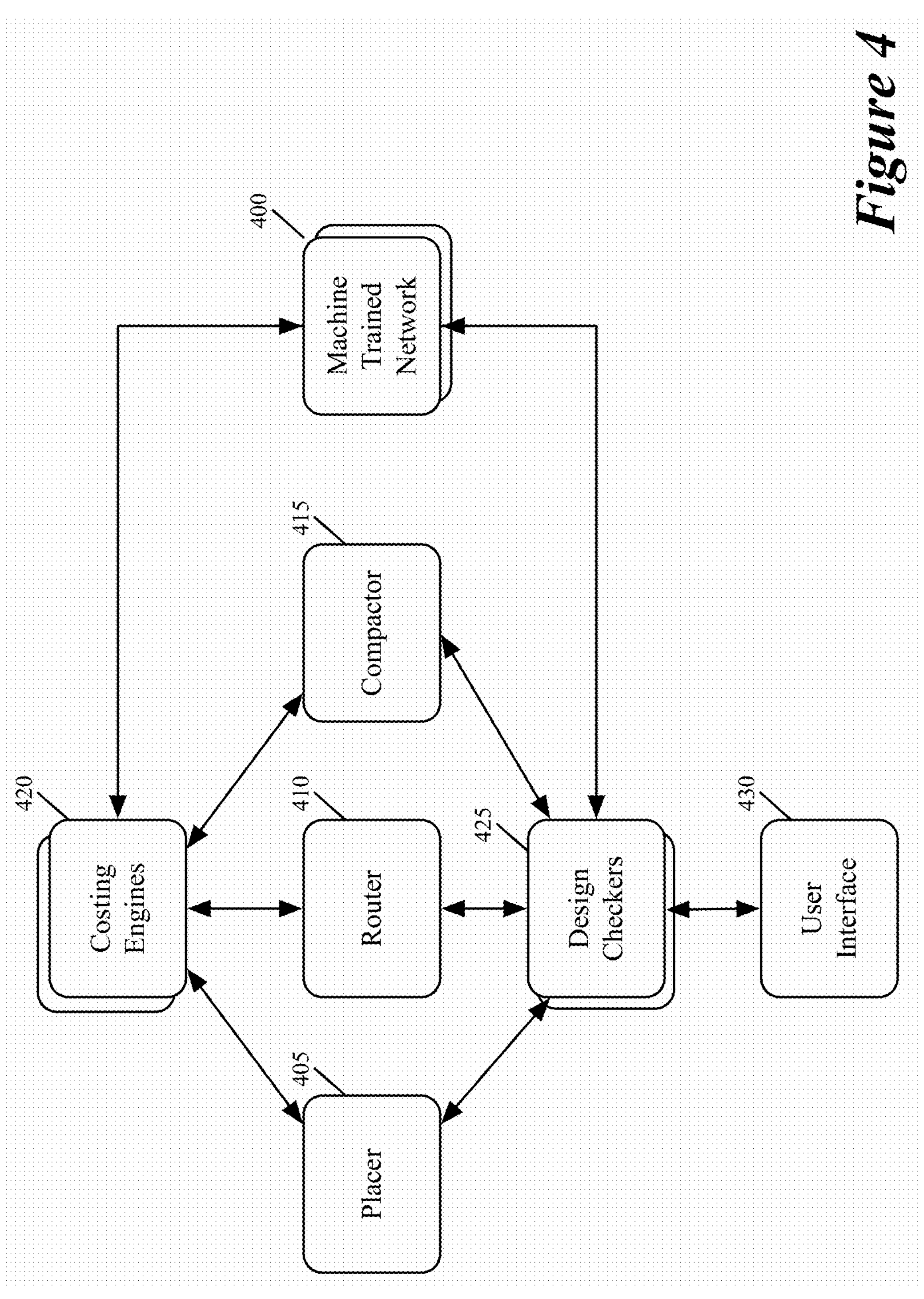
FIG. 4 illustrates several physical design tools that use a set of one or more machine-trained networks to perform their physical design operations.

FIG. 4 illustrates several physical design tools that use a set of one or more machine-trained networks 400 to perform their physical design operations. The physical design tools in this example include a placer 405, a router 410 and a compactor 415. The placer 405 identifies a placement for components of an IC, while the router 410 defines interconnect routes between these components (e.g., routes that connect the pins of these components). The interconnect routes in some embodiments include interconnect lines and vias. The placer 405 can be either a global placer or a detailed placer. Similarly, the router 410 can be either a global router or detailed router. The compactor 415 compacts (i.e., reduces the size of) the physical design produced by the placer 405 or router 410.

As shown, the costing engines 420 and design checkers 425 are used by each of physical design tools 405-415. These engines 420 and checkers 425 use one or more machine-trained networks 400 to perform some or all of the operations that they perform for some or all of the physical design tools 405-415. In some embodiments, a physical design tool uses a costing engine 420 to compute the physical design cost for a physical design after a set of one or more changes (e.g., a set of new placement locations or a set of one or more new routes) are made, and then uses the computed cost to determine whether a set of one or more changes to the physical design should be accepted.

For such changes, the costing engine 420 in some embodiments uses a machine-trained network 400 to predict the physical design after the set of changes instead of just relying on the assumed ideal physical design. The costing engine 420 then computes a cost for the set of changes based on the predicted physical design with the set of changes. It returns the computed cost to the physical design tool, which then uses its search process heuristics to either accept or reject the set of changes (e.g., to accept or reject a set of new placement locations or a set of one or more new routes).

In some embodiments, a physical design tool uses a design checker 425 to determine whether a physical design with a set of one or more changes (e.g., a set of new placement locations or a set of new routes) meets one or more design considerations. The design considerations in some embodiments include design constraints (e.g., spacing constraints, capacitance constraints, etc.) that the physical design has to meet.

After being called by a physical design tool 405-415 to validate a set of possible changes to the current physical design, a design checker 425 (1) uses a machine-trained network 400 to generate a predicted physical design with the set of changes, and then (2) determines whether the predicted physical design meets one or more design constraints enforced by the design checker. When the predicted physical design does not meet a design constraint in the set of design constraints, the design checker in some embodiments notifies the physical design tool that called the checker of this failure. The physical design tool can then determine whether to stick with the constraint violating changes, or to modify the physical design to eliminate the constraint-offending changes.

When the predicted physical design does not meet a design constraint in the set of design constraints, the design checker in some embodiments also can direct another physical design tool to modify the physical design to meet the desired design constraints. For instance, when the compactor 415 produces a compact version of a current physical design, the compactor's design checker 425 has the machine-trained network 400 produce a predicted physical design for the compacted physical design.

If the predicted physical design fails one or more spacing constraints (e.g., one or more neighboring wire pairs are closer than a threshold distance constraint in the predicted physical design), the compactor or its design checker can direct the router 410 to identify one or more new routes for the constraint-violating nets with the wires that are too close to their neighbors. In so directing the router, the compactor or its design checker in some embodiments identifies for the router not only the constraint-violating net identifier, but also the constraint-violating location(s) of the route(s).

Conjunctively, or alternatively, the design checkers 425 in some embodiments generate a display of the predicted physical design produced by one or more physical design tools 405-415, and provide this display through a user interface (UI) 430 for a designer to review. The user interface in some embodiments is a graphical user interface of the physical design tool. The user interface in these or other embodiments includes a web server that provides a browser output through a web interface to any common browser.

The designer reviews the generated display that is provided through the UI 430 to determine whether the predicted physical design meets a set of one or more design considerations. Through the user interface 430, the design checker receives modifications to the current physical design from the designer after the designer has reviewed the displayed predicted physical design and provided input with respect to this design. The design checker then relays these modifications to the physical design tool so that this tool can modify the physical design based on the designer input.

In some embodiments, the design checker 425 identifies areas of potential concern for a designer by highlighting a set of locations (e.g., location 300 in FIG. 3) in the predicted design that should be reviewed by the designer to assess whether a set of shapes at the identified set of locations satisfies design considerations. Also, in some embodiments, the UI 430 has a set of UI tools that allows the designer to provide input regarding a group of locations in the predicted physical design that should be modified. For instance, the UI tools include one or more selection tools through which the designer can select for further analysis locations highlighted by the process 100 and/or other locations in the predicted design layout.

Once the designer identifies this group of locations in the predicted physical design, the design checker 425 identifies a group of locations in the current physical design that corresponds to the identified group of locations in the predicted physical design, and then directs the physical design tool to modify the physical design at the identified group of locations in the current physical design. In some embodiments, the design checker 425 identifies the location in the current physical design by using the set of coordinates in the current physical design that match the set of coordinates identified by the designer in the predicted physical design. In other embodiments, the design checker 425 identifies the locations in the current physical design to analyze by identifying the elements in the current physical design that are associated with the elements in the predicted physical design that were selected by the designer or were in or near a location identified in the predicted physical design by the designer.

Figures 5, 6:
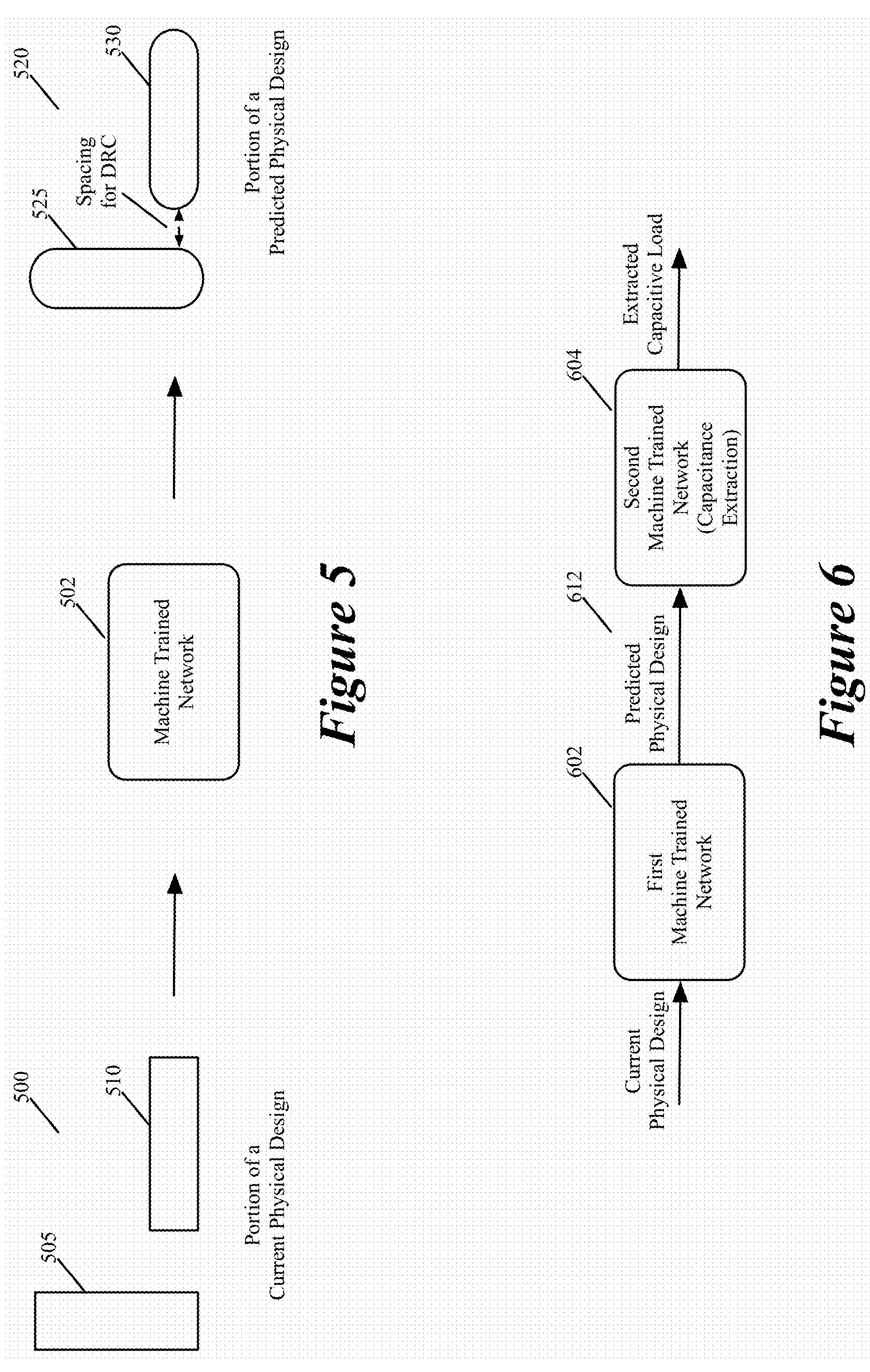
FIG. 5-6 illustrate two examples of using machine trained networks during physical design.

FIG. 5-6 illustrate two other examples of using machine trained networks during physical design. FIG. 5 illustrates an example of a machine trained network 502 that receives a physical design portion 500 with two rectangular wire segments 505 and 510 and produces a corresponding predicted physical design portion 520 with two wire segments 525 and 530 that are predictions as to how the rectangular wire segments will appear at a subsequent manufacturing stage. In some embodiments, the predicted wire segments 525 and 530 are the predicted shapes that a wafer simulator would produce for the physical design portion 500. In some embodiments, the machine trained network 502 can produce such a prediction as its machine-trained parameters (e.g., its machine-trained weight values when the network is a neural network) are trained through a learning process that uses various outputs produced by a wafer simulator for various physical design inputs. Examples of such learning processes, as well as the generation of wafer simulation predicted outputs for different physical design inputs, will be further described below by reference to FIG. 9.

The predicted wire segments 525 and 530 have rounded corners. This is because semiconductor manufacturing processes often produce rounded wire segment ends instead of ninety degree wire segment ends. As shown in FIG. 5, the distance between the rounded ends of the wire segments 525 and 530 is measured to ensure that the two wire segments are farther than a threshold distance that is required by one or more DRC rules. In some embodiments, DRC rules are enforced during routing operations in order to ensure that the identified routes do not violate spacing constraints specified by one or more DRC rules. The DRC rules in some embodiments are enforced during routing as part of a set of constraints that are evaluated for individual routes that the router identifies, or on paths that the router identifies before embedding the identified paths in the design as routes. The DRC rules are used to exclude routing solutions that the router identifies when these solutions do not satisfy the set of constraints that are expressed with these rules.

Conjunctively, or alternatively, by using a machine trained network 502 to perform DRC during routing, some embodiments use one or more machine trained networks to compute a cost for one or more routes that a router generates for one or more nets. For instance, FIG. 6 illustrates two machine-trained networks 602 and 604 that a router in some embodiments uses to compute a cost for one or more routes that the router generates for one net or for multiple nets. The first machine trained network 602 produces a predicted physical design 612 for a current physical design that the first network 602 processes.

The second machine trained network 604 then performs capacitance extraction by processing the predicted physical design to produce a predicted capacitive load on one or more wire segments in the predicted physical design. Examples of performing such capacitive load calculations are described in U.S. patent application Ser. No. 17/871,893, now issued as U.S. Pat. No. 12,488,175, which is incorporated herein by reference. As described in this application, a machine trained network (such as network 604) in some embodiments computes capacitance coefficients from which another program computes the capacitive load on one or more wire segments or other components in the IC design. Several other mechanisms for using a machine trained network to perform capacitance extraction are described in U.S. patent application Ser. No. 17/871,893.

In some embodiments, the router uses the first and second machine trained networks 602 and 604 to perform capacitance extraction for a route that it defines and/or for previously defined wire segments near this route. The router then uses the computed capacitive load (produced by the capacitance extraction) on this route and/or on the previously defined wire segments as costs that it uses to evaluate whether to keep or discard the identified route. In some embodiments, the router performs this operation for an individual route that it identifies for a net. In other embodiments, the router performs this operation for multiple routes that it identifies for one net or for several nets, to determine whether it should keep any of the routes. In still other embodiments, the router uses the machine-trained networks to perform capacitance extraction while it is performing a path search to identify a route for a net (i.e., before it has identified the route for the net).

The physical design tool (e.g., the router) in some embodiments uses one or more machine-trained networks to produce for a current physical design shape (e.g., for an identified route) a predicted physical design shape (e.g., predicted route) that has multiple contours. Each contour of the predicted shape (1) represents a different prediction as to how the current physical design shape will appear at a subsequent manufacturing stage, and (2) corresponds to a different variation of a manufacturing parameter or a set of two or more manufacturing parameters. Examples of such contours, of the machine-trained network that produces these contours and of the training process for these networks are described in U.S. Published Patent Application 2022/0128899, which are incorporated herein by reference.

Figure 7:
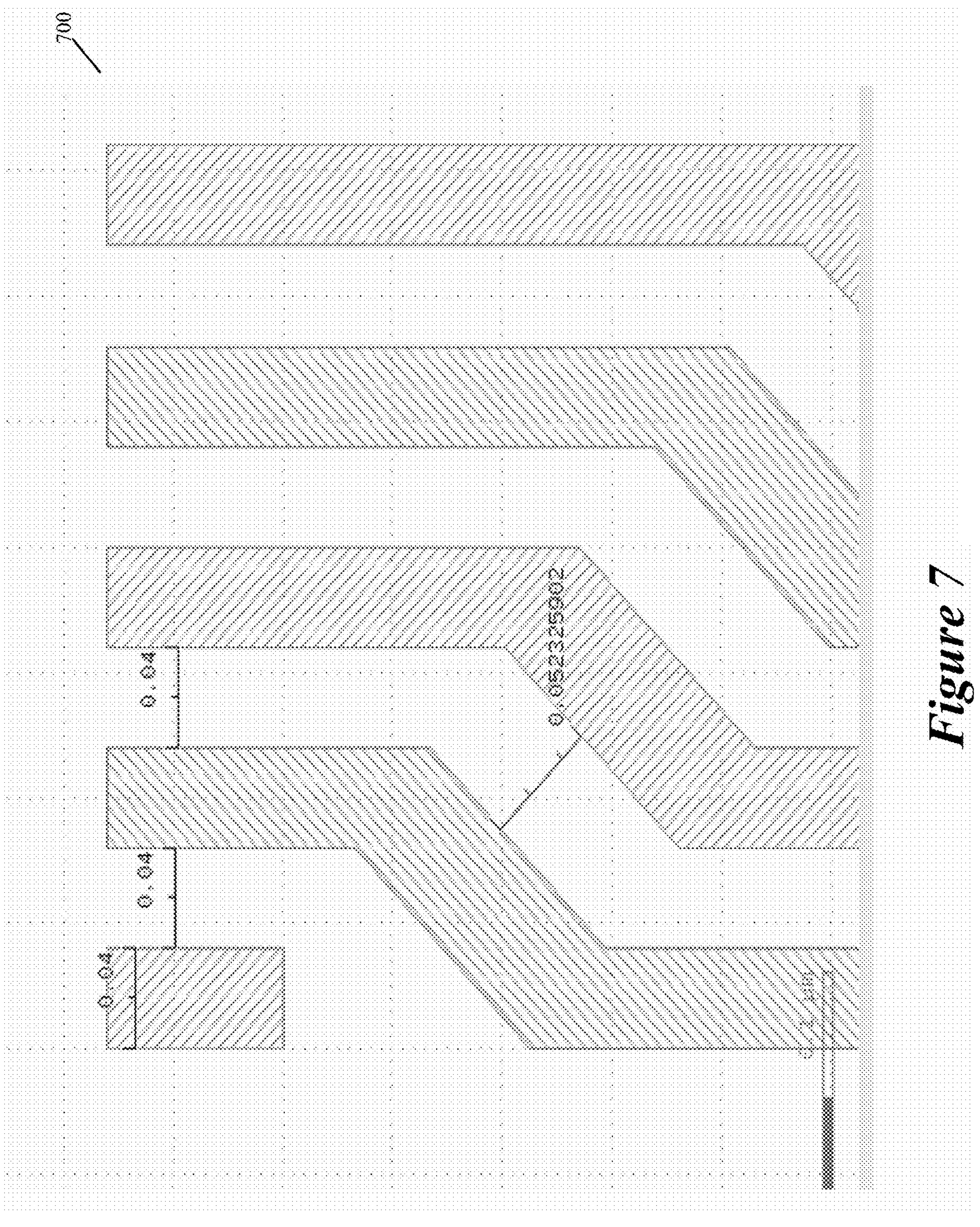
FIG. 7 illustrates a bus with several lines that traverse vertically with a diagonal jog going from left-to-right as the bus lines move upwards in the design.
Figure 8:
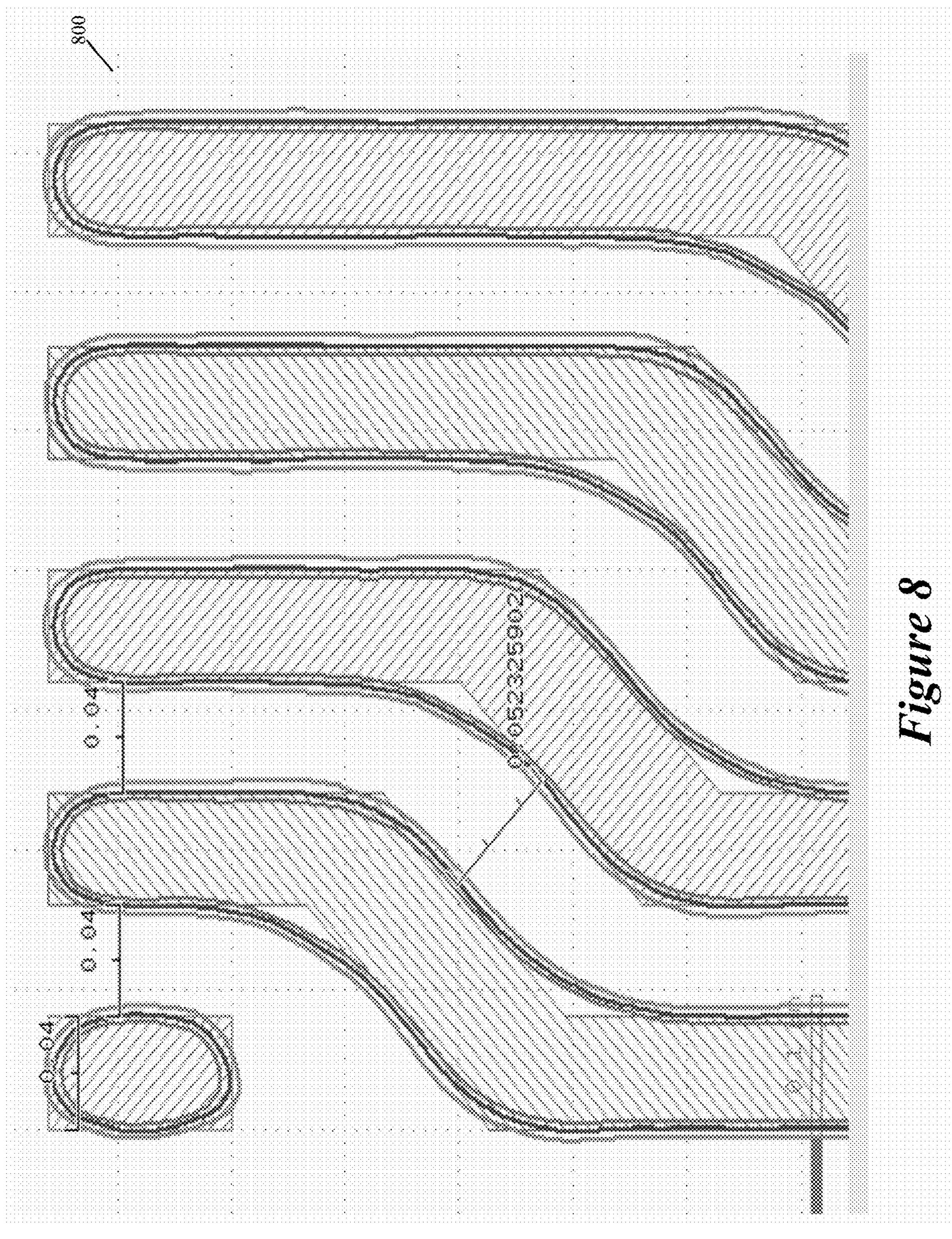
FIG. 8 illustrates a predicted bus that serves as a prediction as to how the bus in FIG. 7 will appear under different variations of a manufacturing process parameter.

FIGS. 7 and 8 illustrate examples of such multi-contoured predicted shapes. FIG. 7 illustrates a bus 700 with several lines that traverse vertically with a diagonal jog going from left-to-right as the bus lines move upwards in the design. FIG. 8 illustrates a predicted bus 800 that serves as a prediction as to how the bus 700 will appear under different variations of a manufacturing process parameter, such as different doses to account for mask variations, or different depth of focus and exposure strengths for wafer production variations. The three manufacturing-process variations for the three contours in this example represent a nominal process condition, a minimum process condition and a maximum process condition.

In some embodiments, one or three machine trained networks output the predicted bus 800 when the bus 700 is supplied to it to process. As further described below, some embodiments produce different sets of outputs for the different manufacturing process variations for the same set of design inputs, and then use the set of design inputs with its corresponding produced output sets to train one or three machine trained networks to produce the multi-contour shapes.

In this example, a minimum distance of 0.04 microns is needed between the bus lines. However, as shown in FIG. 8, the distance between the contours that correspond to the maximum process variation for the manufacturing parameter at issue (e.g., for dosage or depth of focus) is less than 0.04 microns. When a physical design tool uses a machine-trained network to produce these multi-contour predicted shapes, the tool can then detect that the bus 700 will likely result in a DRC violation, e.g., when the maximum variation is experienced for a particular manufacturing process parameter. Under such circumstances, the tool or the designer would have to change the spacing of the bus lines if it is desired to produce a physical design that can tolerate the maximum variation of the manufacturing parameter.

As shown in FIG. 8, diagonal jogs of horizontal or vertical route segments often result in curvilinear jogs that have a wider width than the diagonal jogs. Such wider widths are the reason why DRC spacing constraints are often very pessimistic when determining how close diagonal jogs can be to other components (e.g., other wires or objects) in the design. Moreover, general-purpose IC design rules have to be somewhat pessimistic/conservative in nature, in order to cater to a wide variety of designs, as it is not known a-priori what polygons will neighbor other polygons during an IC layout, and so the rules have to be able to accommodate just about every possibility. As further discussed below, some embodiments also account for neighborhood variations during the learning process of the machine trained networks, so that these networks can produce predicted shapes that account for possible neighborhood variations.

Using machine-trained networks to produce predicted multi-contour shapes that represent a range of predicted shapes of IC design components over a range of process variations and/or neighborhoods allows a physical design tool and/or a designer to use less conservative DRC rules. This is because the machine-trained networks produce a more accurate assessment of what the IC design components would look like, which in turn allows the physical design tool and/or the designer to be less pessimistic regarding the range of possible shapes that would be produced during the mask making and IC fabrication.

Manufacturing process variations and neighborhood-induced variations have a large impact on design performance and manufacturing reliability. Hence, it is desirable to allow circuit and/or mask designers to visualize the effects of the different variation sources in the context of their actual design. For example, process variations can cause the width of a pattern in the physical design to vary from the intended or target width. This can be because of pattern width variation in the photomask, which then cause a pattern width variation on a wafer that is exposed using the photomask in an optical lithographic process. The sensitivity of the wafer pattern width to variations in photomask pattern width is called mask edge error factor, or MEEF. In an optical lithography system using a 4× photomask, where the optical lithographic process projects a 4× reduced version of the photomask pattern onto the wafer, a MEEF of 1, for example means that for each 1 nm error in pattern width on a photomask, the pattern width on the wafer will change by 0.25 nm. A MEEF of 2 means that for a 1 nm error in photomask pattern width, the pattern width on the wafer will change by 0.5 nm. For the smallest integrated circuits processes, MEEF may be greater than 2. With a good visualization/understanding of these variation sources/effects, a designer can modify the design itself (or the shapes comprising the design) to be more robust to such variation.

By using machine trained networks to produce predicted physical designs for one or more designs that are explored by a physical design tool, some embodiments allow a designer or a design tool to use more realistic design rules. Having more realistic design rules is highly beneficial as designers often need to squeeze the IC design components closer together, while maintaining manufacturability of the components, and the ability to connect to the components on the layers above and below, among other things. Without the benefit of some embodiments of the invention, standard restricted design rules normally constrain the user to employ pessimistic spacing rules.

Different embodiments use different types of machine-trained networks and train these networks differently. In some embodiments, one or more of the machine-trained networks are neural networks. Some embodiments train a neural network to produce a predicted physical design layout from a current physical design layout by using many input data sets with known output data sets to train the configurable parameters (e.g., the weight values) of the neural network. In some embodiments, the input/output sets are portions of IC designs for a particular IC manufacturing process (e.g., X nm designs) with the input portions being portions of physical designs produced by physical design tools, and output portions being the corresponding wafer simulation portion or circuit portion that is produced for the physical-design portion.

Some embodiments put the machine trained neural networks through learning processes that account for (1) manufacturing variations in one or more manufacturing parameters (such as dosage and focus depth) and/or (2) neighborhood variations that account for different possible components that neighbor input component patterns that are part of the inputs used for the learning processes. To train the neural network, some embodiments feed each known input through the neural network to produce a predicted output, and then compare this predicted output to the known output of the input to identify a set of one or more error values. The error values are accumulated over a group of known inputs/outputs, and are then back propagated through the neural network to train the configurable parameters (e.g., the weight values) of the neural network. Once trained by processing a large number of known inputs/outputs, the neural network can then be used to facilitate physical design operations, e.g., according to any of the above-discussed operations that were described by reference to FIGS. 1-8.

Figure 9:
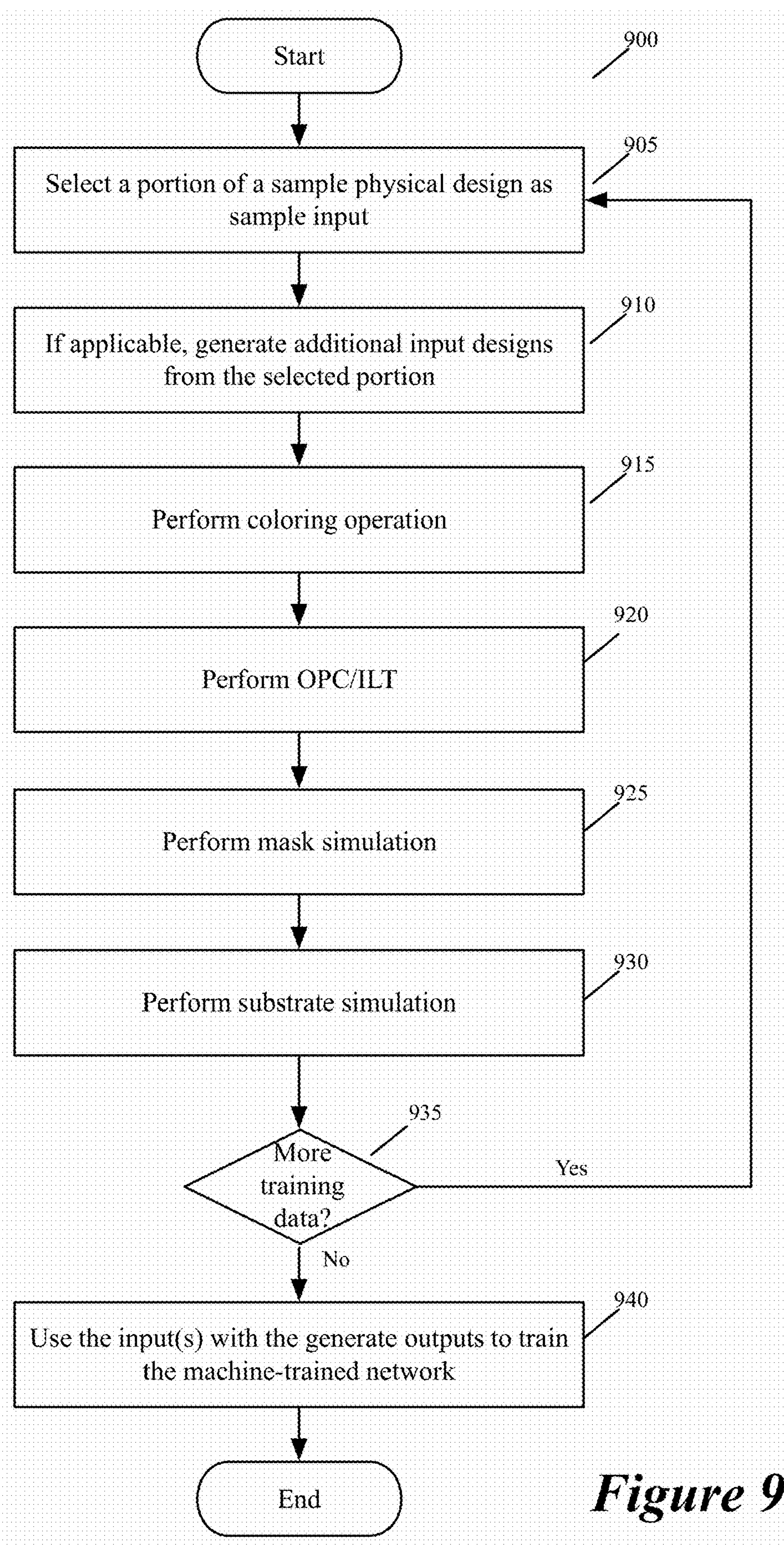
FIG. 9 illustrates a process that some embodiments use to produce training data to train one or more neural networks to produce multi-contour output shapes for input shapes of an IC design or a portion of an IC design.

FIG. 9 illustrates a process 900 that some embodiments use to produce training data to train one or more neural networks to produce multi-contour output shapes for input shapes of an IC design or a portion of an IC design. The training data includes known input IC design portions, and simulated output IC design portions produced by the process 900. This process is referred to as a digital twin process as it simulates the manufacturing process, and produces predicted manufactured wafer shapes that are the digital twin of the actual manufactured wafer shapes.

The process 900 initially selects (at 905) a portion of a sample physical design as an input pattern for which it needs to generate one or more predicted output patterns. In some embodiments, the process 900 uses multiple different sample physical designs from which it extracts sample input patterns at 905. The extracted input pattern is part of a previously defined physical design, which may or may not have been used to manufacture an IC on a substrate (such as a silicon wafer). This pattern can include manufacturable shapes for circuit components (such as logic gates, transistors, metal layers, and other items that are required to be found in an IC's physical design). The physical design may be rectilinear, piecewise linear, partially curvilinear, or completely curvilinear. Curvilinear patterns (each with at least one curvilinear segment) are extremely compute-intensive, and thus being able to optimize patterns by calculating the cumulative effects of variations from multiple manufacturing stages is very valuable for curvilinear patterns.

At 910, if applicable for the selected physical design input pattern, the process 900 generates several possible nearby patterns that neighbor the physical design input pattern selected at 905. In some embodiments, the physical design pattern selected at 910 might be used in one or more subsequent IC designs and end up with different neighboring patterns in these subsequent IC designs. Some embodiments synthesize the neighborhood variations by using Monte Carlo techniques that enumerate several possible solutions.

In some embodiments, the physical design pattern selected at 910 along with each of its synthesized neighborhood variations represents a different input for which the process 900 produces a different output for the training process (also called the learning process) of a machine-trained network. In other embodiments, the selected physical design input is just one input datum, and its neighborhood variations are just used to identify contour variations during subsequent simulation operations of the process 900.

One example where it is useful to identify such neighborhood variations is when the input pattern is part of a standard cell design, which can be randomly placed in all the possible neighborhoods it might eventually end up in, i.e., surrounded by the various neighboring cells it is likely to be surrounded by in subsequent circuit designs. In some embodiments, the selected portion of the physical design pattern is an instance of the physical design pattern and the generated nearby patterns include possible neighborhoods of this instance. Instances of the cell of interest, in its various legal orientations, would therefore be placed alongside various orientations of various neighbor cells, with instances of those various neighbors placed above/below, to left of or to right of, and with various offsets in the placements. In some embodiments, the selected input pattern is the entire design of a standard cell design containing several standard cells, and the possible neighborhoods includes all legal orientations of the standard cells.

At 915, the process performs a coloring operation that separates an input pattern (e.g., the pattern selected at 905 or a pattern generated at 910 for the selected pattern) into multiple mask layers. In the coloring operation, each feature of the input pattern on a reticle layer is colored to reflect the assignment of a feature to a particular mask layer. After the colorization operation, the process 900 performs (at 920) an optical proximity correction (OPC) operation to produce one or more possible sets of mask designs, with each set of mask design corresponding to the input pattern selected at 905 or a possible neighborhood generated identified at 910.

For the selected input pattern, the generated mask designs in some embodiments include a nominal mask design with variation. In some embodiments, the possible mask designs produced at 920 may be combined to create the nominal mask design with variations. Conventionally, the nominal mask design can be determined using a nominal dose, such as 1.0 and calculating a nominal contour of a mask design at a threshold, such as 0.5. In some embodiment, the nominal contour of the mask design is calculated from several possible mask designs. The variation may be calculated for all possible neighborhoods generated at 910.

In some embodiment, the OPC operation includes an ILT (inverse lithography technology) operation. The ILT operation in some embodiments creates ideal curvilinear ILT patterns, while in other embodiments, the ILT operation rectilinearizes the curvilinear patterns. OPC features or ILT patterns for the same physical design pattern will vary from neighborhood to neighborhood. Some embodiments calculate several possible sets of mask images from several possible mask designs in each of the many possible neighborhoods. In some embodiments, a nominal mask design is calculated from the calculated OPC features or ILT patterns in many possible neighborhoods.

The process 900 performs (at 925) a mask simulation operation to produce mask data preparation (MDP), which prepares the mask design for a mask writer. This operation in some embodiments includes "fracturing" the data into trapezoids, rectangles, or triangles. This operation also includes in some embodiments Mask Process Correction (MPC), which geometrically modifies the shapes and/or assigns dose to the shapes to make the resulting shapes on the mask closer to the desired shape. MDP may use as input the possible mask designs or the results of MPC. MPC may be performed as part of a fracturing or other MDP operation. Other corrections may also be performed as part of fracturing or other MDP operations, the possible corrections including: forward scattering, resist diffusion, Coulomb effect, etching, backward scattering, fogging, loading, resist charging, and EUV midrange scattering. Pixel-level dose correction (PLDC) may also be applied during the mask simulation operation. In other embodiments, a VSB (variable shaped beam) shot list or exposure information for multi-beam may be generated to produce several possible mask images from the possible mask designs. In some embodiments, a set of VSB shots is generated for a calculated mask pattern in the plurality of calculated mask patterns. In some embodiments, MPC and/or MDP may be performed on the possible mask designs.

In some embodiments, the mask simulation operation calculates several possible mask images by using charged particle beam simulation. Effects that may be simulated include forward scattering, backward scattering, resist diffusion, Coulomb effect, fogging, loading and resist charging. Mask simulation in some embodiments also includes mask process simulation where the effects of various post-exposure processes are calculated. These post-exposure processes may include resist baking, resist development and etch. When charged particle beam simulation is performed for the mask on any given layer, the simulation may be performed over a range of process variations to establish manufacturability contours for the mask itself. The contours may extend from a nominal contour, where the nominal contour may be based on a pattern produced at a particular resist threshold, for example, at a threshold of 0.5. In some embodiments, calculating a given percentage difference in exposure dose, for example, +/−10% dose variation creates a mask image with variation for displaying in a viewport. These variations include upper and lower bounds of a process variation band surrounding the nominal contour. In some embodiments, the plus and minus variations may differ from each other, for example +10% and −8%. Charged particle beam simulation and mask process simulation are performed separately from each other.

After the mask simulation, the process 900 performs (at 930) a substrate simulation operation that calculates possible substrate patterns that would result from using the generated masks. For the input pattern selected at 905, the generated substrate pattern represents an output pattern or a range of output patterns (when the produced shapes have multiple contours to account for process variations and manufacturing parameter variations). The selected input pattern and the generated output pattern represent a known input with a known output that are used to train the machine-trained neural network in some embodiments. Once trained, the neural network can then be used during physical design to assist in the physical design operations in the manner described above by reference to FIGS. 1-8.

In some embodiments, the substrate simulation operation (at 930) includes a lithography simulation that uses the calculated mask images. The operation at 930 calculates several possible patterns on the substrate from the plurality of mask images. Each pattern on the substrate in some embodiments corresponds to a set of manufacturing variation parameters. Calculating a substrate pattern from a calculated mask image is described in U.S. Pat. No. 8,719,739, entitled "Method and System for Forming Patterns Using Charged Particle Beam Lithography", which is incorporated herein by reference.

The possible patterns on the substrate may be combined to create a nominal substrate pattern with variation. In some embodiments, sources of substrate pattern variation will include some given variation in exposure (dose) in combination with some given variation in depth of focus, for example +/−10% in exposure, and +/−30 nm in depth of focus. In some embodiments, the plus and minus variations may differ from each other, for example +5%/−7% and 30 nm/−28 nm. Conventionally, statistical methods are used to create a 3-sigma variation from the nominal contour. The variation comprises a lower bound 3-sigma less than the nominal contour for a minimum, and an upper bound 3-sigma greater than the nominal contour for a maximum. Instead of calculating the 3-sigma variation extending from the nominal contour, some embodiments create a mask image with variation by combining several mask images including process variation bands with a lower bound and an upper bound.

In some embodiments, the substrate patterns can be formed on a wafer using an optical lithographic process using the mask image with variation. The substrate simulation operation in some embodiments includes a wafer process simulation on the substrate patterns. Wafer process simulation in some embodiments include simulation of resist baking, resist development and etch. The process 900 in some embodiments performs the lithography simulation and wafer process simulation as separate steps, optionally with each step accounting for process variations.

In some embodiments, the process 900 will take into account variations of different operations in a statistically cumulative manner, such that the process accounts for variation from previous operations in subsequent operations. In this manner, the substrate patterns in the subsequent operations will have incorporated not only variations in determining possible patterns on a substrate but also variations in mask process and mask design.

After the substrate simulation, the process 900 in some embodiments calculates a process variation band from the possible substrate patterns generated from the substrate simulation. To make the calculations of the many possible combinations of variations more efficient, the variations may be accumulated using insights in how certain variations and pattern parameters might affect each other. For instance, rather than simply feeding the minimum and maximum 3-sigma values from one step into the next, a worst case variation that is fed into the next step could take into account the distance of one pattern from another. This is because features in closer to proximity to each other affect each other more than features that are farther apart. Because of the impact these variations have on design performance and manufacturing reliability, it may be desirable to allow designers to visualize the effects of the different variation in the context of an actual circuit design. Visualizing the effects of the statistically cumulative variation as predicted on the substrate can be shown after calculating the variation band, or by visualizing the effects of the different variations in each step.

At 935, the process determines whether it has generated a sufficient number of known input and output patterns. If not, the process returns to 905 to select another input pattern from a previously defined physical design, and then repeats its operations 910-930 to produce the simulated output substrate pattern for this input pattern. As mentioned above, the selected input patterns and their corresponding generated output patterns represent known inputs with known outputs that are used to train the machine-trained neural network in some embodiments.

Calculating a pattern to be manufactured on a substrate by calculating several substrate simulation patterns from several calculated mask images, which are calculated from several mask designs, can take significant time. Accordingly, some embodiments use the process 900 of FIG. 9 to generate numerous set of known input/output patterns, and then use these known input/output patterns (at 940) to train a neural network so that this neural network can later be used to quickly produce predicted output patterns from input patterns that are examined during physical design operations.

To train the neural network, some embodiments feed each known input through the neural network to produce a predicted output, and then compare this predicted output to the known output of the input to identify a set of one or more error values. The error values are accumulated over a group of known inputs/outputs, and are then back propagated through the neural network to train the configurable parameters (e.g., the weight values) of the neural network. Once trained by processing a large number of known inputs/outputs, the neural network can then be used to facilitate physical design operations.

In some embodiment, the physical design tools perform some or all of their operations and define their designs in the pixel domain rather than contour domain. This is because pixel-based designs are ideal for analysis by machine trained networks, because these networks are often optimized to process pixel-based data sets rather than contour-based descriptions. Pixel-based designs also make the representation and processing of curvilinear shapes in the design easier. Hence, by expressing the results of a physical design operation (e.g., a route) in the pixel domain instead of the contour domain, some embodiments make it much easier for the physical design tools to use machine trained networks and to quickly process curvilinear shapes in the design.

Similarly, to facilitate the creation of their masks, some embodiments use the pixel domain for performing the processing needed to generate their masks, because curvilinear masks manipulated in the pixel domain take the same amount of time as any Manhattan design. Also, this processing is often performed on GPUs in the pixel domain. The vast power of GPU processing power for this type of pixel manipulations is ideal because GPUs are single-instruction multiple-data (SIMD) machines that excel in the pixel domain, as a single instruction stream can be applied to a large number of pixels uniformly. The SIMD architecture can be relied upon to produce a much higher computing throughput for processing physical designs and masks with curvilinear shapes.

Contours (also called geometries) are usually expressed as piecewise linear polygons, but sometimes expressed with infinite-resolution curvilinear formats like splines. Manipulating contours is a mathematical dual of manipulating pixel based data, given a resolution limit. A mathematical dual means that, functionally, anything that can be done in one can be done in the other. However, when runtime performance or efficiency is taken into account, given a particular accuracy of result as the target, the computational behavior of one can be quite different from the other.

In general, manipulating shapes that are mostly large rectangles would be fast in contour domain (i.e., geometry domain), while manipulating shapes that are largely polygonal or curvilinear with higher vertex density would be faster in the pixel domain. In the pixel domain, pixel size is defined naturally from the resolution limit. Once pixel size is defined, it does not matter whether the shapes being processed are curvilinear or rectilinear. The computation either way is constant time. In contour based manipulation, this is not the case as computation time depends on number of edge count of the piecewise linear that is used to represent the contours. Also, given that much of the data processing these data is performed by high powered GPUs, pixel-based analysis is preferable to contour-based analysis as GPUs are SIMD machines that excel in the pixel domain.

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs, when installed to operate on one or more electronic systems, define one or more specific machine implementations that execute and perform the operations of the software programs.

Figure 10:
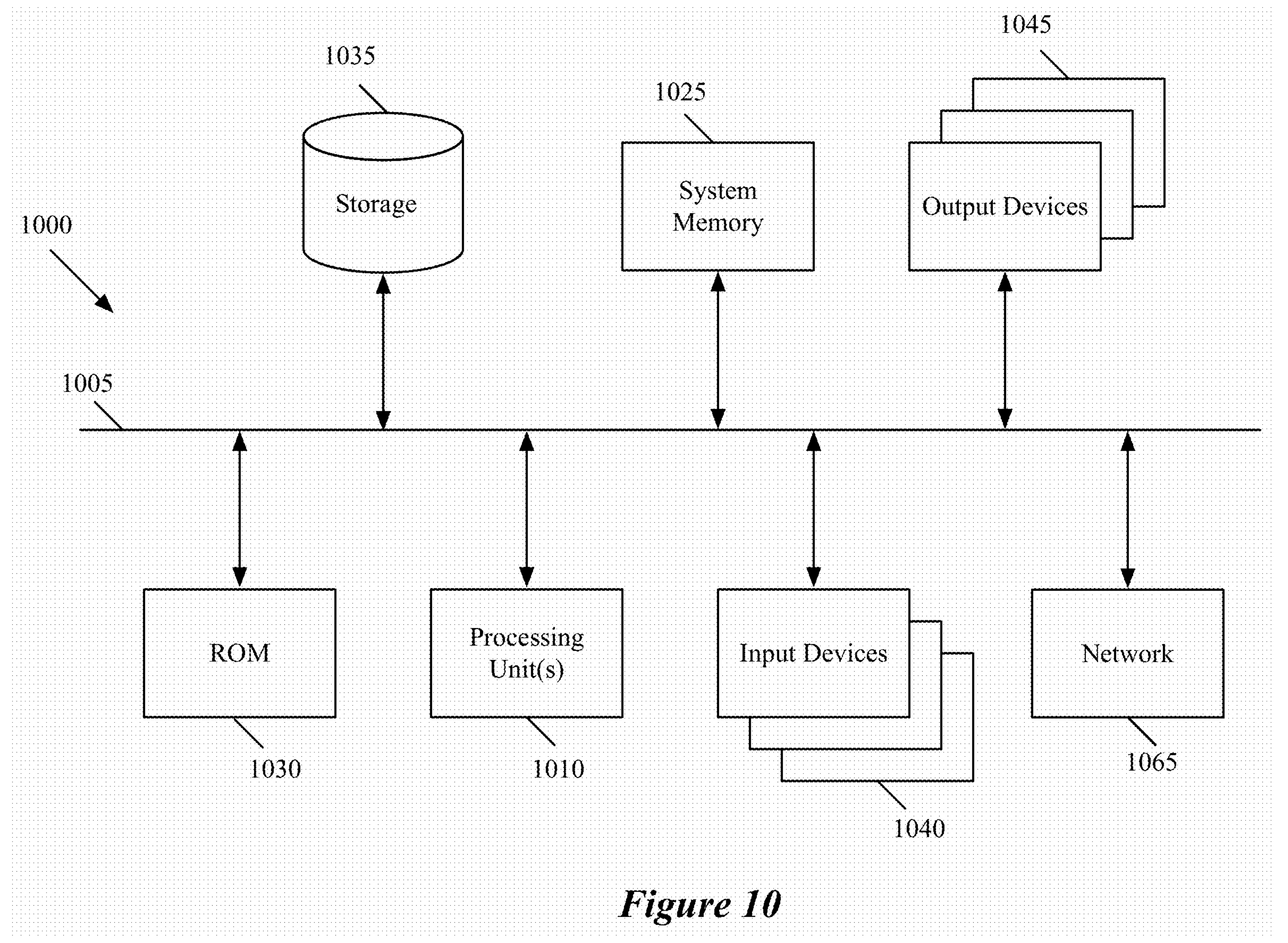
FIG. 10 conceptually illustrates an electronic system with which some embodiments of the invention are implemented.

FIG. 10 conceptually illustrates an electronic system 1000 with which some embodiments of the invention are implemented. The electronic system 1000 may be a computer (e.g., a desktop computer, personal computer, tablet computer, server computer, mainframe, a blade computer etc.), phone, PDA, or any other sort of electronic device. As shown, the electronic system includes various types of computer readable media and interfaces for various other types of computer readable media. Specifically, the electronic system 1000 includes a bus 1005, processing unit(s) 1010, a system memory 1025, a read-only memory 1030, a permanent storage device 1035, input devices 1040, and output devices 1045.

The bus 1005 collectively represents all system, peripheral, and chipset buses that communicatively connect the numerous internal devices of the electronic system 1000. For instance, the bus 1005 communicatively connects the processing unit(s) 1010 with the read-only memory (ROM) 1030, the system memory 1025, and the permanent storage device 1035. From these various memory units, the processing unit(s) 1010 retrieve instructions to execute and data to process in order to execute the processes of the invention. The processing unit(s) may be a single processor or a multi-core processor in different embodiments.

The ROM 1030 stores static data and instructions that are needed by the processing unit(s) 1010 and other modules of the electronic system. The permanent storage device 1035, on the other hand, is a read-and-write memory device. This device is a non-volatile memory unit that stores instructions and data even when the electronic system 1000 is off. Some embodiments of the invention use a mass-storage device (such as a magnetic or optical disk and its corresponding disk drive) as the permanent storage device 1035.

Other embodiments use a removable storage device (such as a floppy disk, flash drive, etc.) as the permanent storage device. Like the permanent storage device 1035, the system memory 1025 is a read-and-write memory device. However, unlike storage device 1035, the system memory is a volatile read-and-write memory, such a random access memory. The system memory stores some of the instructions and data that the processor needs at runtime. In some embodiments, the invention's processes are stored in the system memory 1025, the permanent storage device 1035, and/or the read-only memory 1030. From these various memory units, the processing unit(s) 1010 retrieve instructions to execute and data to process in order to execute the processes of some embodiments.

The bus 1005 also connects to the input and output devices 1040 and 1045. The input devices enable the user to communicate information and select commands to the electronic system. The input devices 1040 include alphanumeric keyboards and pointing devices (also called "cursor control devices"). The output devices 1045 display images generated by the electronic system. The output devices include printers and display devices, such as cathode ray tubes (CRT) or liquid crystal displays (LCD). Some embodiments include devices such as a touchscreen that function as both input and output devices.

Finally, as shown in FIG. 10, bus 1005 also couples electronic system 1000 to a network 1065 through a network adapter (not shown). In this manner, the computer can be a part of a network of computers (such as a local area network ("LAN"), a wide area network ("WAN"), or an Intranet, or a network of networks, such as the Internet. Any or all components of electronic system 1000 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself.

As used in this specification, the terms “computer”, “server”, “processor”, and “memory” all refer to electronic or other technological devices. These terms exclude people or groups of people. For the purposes of the specification, the terms display or displaying means displaying on an electronic device. As used in this specification, the terms “computer readable medium,” “computer readable media,” and “machine readable medium” are entirely restricted to tangible, physical objects that store information in a form that is readable by a computer. These terms exclude any wireless signals, wired download signals, and any other ephemeral or transitory signals.

While the invention has been described with reference to numerous specific details, one of ordinary skill in the art will recognize that the invention can be embodied in other specific forms without departing from the spirit of the invention. For instance, a number of the figures conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Therefore, one of ordinary skill in the art would understand that the invention is not to be limited by the foregoing illustrative details, but rather is to be defined by the appended claims.

The invention claimed is:

1. A method for performing physical design, the method comprising:

receiving a first physical design layout that specifies a design for at least a portion of an integrated circuit (IC) that is to be manufactured;

supplying the first physical design to a machine-trained network that generates a second physical design layout that is a prediction of how the first physical design layout will be produced when manufactured as an IC on a wafer; and using the second physical design layout to modify the first physical design layout, said using the second physical design layout comprising using a router to modify a set of one or more routes defined in the first physical design layout, wherein after the physical design is completed and a final physical design layout is produced, a set of one or more masks are produced based on the final physical design layout and a set of lithographic processes use the produced set of masks to manufacture the IC.

2. The method of claim 1, wherein using the second physical design layout further comprises:

generating a display of the second physical design layout for a designer to review;

receiving, through a user interface, modifications to the first physical design layout; and modifying the first physical design layout based on the received modifications, wherein the designer reviews the generated display to determine whether the second physical design layout meets a set of one or more design considerations.

3. The method of claim 1, wherein using the second physical design layout further comprises using a placer to perform a set of placement operations that modify locations of a set of circuit components in the physical design.

4. The method of claim 1, wherein using the second physical design layout further comprises using the second physical design layout to determine whether a set of one or more design constraints has been met, wherein using the router comprises modifying the set of one or more routes defined in the first physical design layout after determining that the second physical design layout does not meet a design constraint in the set of design constraints.

5. The method of claim 1, wherein using the second physical design layout further comprises:

using the second physical design layout to compute a physical design cost for the first physical design layout; and using the computed cost to determine whether a set of one or more changes to the first physical design layout should be accepted.

6. The method of claim 1 further comprising:

receiving a set of manufacturing parameters for manufacturing the IC based on the first physical design layout; and using the set of manufacturing parameters to define a set of parameters of the machine-trained network before the machine-trained network is used to generate the second physical design layout.

7. The method of claim 6, wherein the set of manufacturing parameters comprises a set of manufacturing variances that expresses a range of one or more variations in using a particular manufacturing process to manufacture design components according to the first physical design layout.

8. The method of claim 7, wherein the set of manufacturing variances comprises a set of variations in a set of manufacturing processes used to manufacture the IC from the first physical design layout.

9. The method of claim 8, wherein the set of manufacturing processes comprises a set of processes to manufacture the set of masks used to fabricate the IC.

10. The method of claim 1 further comprising receiving a set of manufacturing parameters for manufacturing the IC based on the first physical design layout, wherein supplying the first physical design to the machine-trained network comprises using the set of manufacturing parameters along with the first physical design layout as inputs to the machine-trained network in order to generate the second physical design layout.

11. The method of claim 10, wherein the set of manufacturing parameters comprises a set of manufacturing variances that expresses a range of one or more variations in using a particular manufacturing process to manufacture design components according to the first physical design layout.

12. The method of claim 1, wherein the machine-trained network produces an output that comprises the second physical design layout.

13. The method of claim 1, wherein the machine-trained network produces a set of parameters, the method further comprising using the set of parameters produced by the machine-trained network to generate the second physical design layout.

14. The method of claim 13, wherein the set of parameters express one or more manufacturing ranges, each manufacturing range expressing a range of variations for manufacturing one component in the first physical design layout.

15. The method of claim 1, wherein;

the first and second physical design layouts each comprises a plurality of shapes of a plurality of design components;

a group of shapes in the second physical design layout represent predicted manufactured shapes of a group of shapes in the first physical design layout; and using the second physical design layout further comprises determining whether one or more shapes in the second physical design layout satisfy one or more design considerations.

16. The method of claim 15, wherein the design considerations are design constraints and the determination comprises determining whether one or more shapes in the second physical design layout violate one or more design constraints.

17. The method of claim 16, wherein the design constraints comprise a set of capacitance constraints.

18. The method of claim 16, wherein the design constraints comprise a set of distance constraints.

19. The method of claim 15, wherein determining whether one or more shapes in the second physical design layout satisfy one or more design considerations comprises:

providing a display of the second physical design layout and identifying a set of locations in the second physical design layout that should be reviewed to assess whether a set of shapes at the identified set of locations satisfy design considerations.

20. The method of claim 19, wherein using the second physical design layout further comprises:

receiving user input regarding a group of locations in the second physical design layout that should be modified;

identifying a group of locations in the first physical design layout that corresponds to the group of locations in the second physical design layout; and modifying the first physical design layout at the identified group of locations in the first physical design layout.

21. The method of claim 1, wherein the machine-trained network receives one or more patterns as inputs and produces an output that represents a transformed pattern for each input pattern, each transformed pattern representing a predicted manufactured appearance of its corresponding input pattern.

22. A method for performing physical design, the method comprising:

receiving a first physical design;

using a machine-trained network to generate a second physical design that is a prediction of how the first physical design will be produced at a subsequent manufacturing stage; and using the second physical design to modify the first physical design, wherein said modifying the first physical design comprises using a router to modify a set of one or more routes defined in the first physical design by defining a new route for at least one net in the first physical design.

23. A method for performing physical design, the method comprising:

receiving a first physical design;

using a machine-trained network to generate a second physical design that is a prediction of how the first physical design will be produced at a subsequent manufacturing stage; and using the second physical design to modify the first physical design, wherein said modifying the first physical design comprises using a placer to modify a set of placement locations in the first physical design of a set of one or more circuits defined in the first physical design.

* * * * *